United States Patent
Kubota

(10) Patent No.: US 12,044,755 B2
(45) Date of Patent: Jul. 23, 2024

(54) MAGNETIC SENSOR CHIP AND MAGNETIC SENSOR DEVICE

(71) Applicant: Murata Manufacturing Co., Ltd., Nagaokakyo (JP)

(72) Inventor: Masashi Kubota, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 162 days.

(21) Appl. No.: 17/960,160

(22) Filed: Oct. 5, 2022

(65) Prior Publication Data

US 2023/0027879 A1    Jan. 26, 2023

Related U.S. Application Data

(63) Continuation of application No. PCT/JP2021/001868, filed on Jan. 20, 2021.

(30) Foreign Application Priority Data

Jun. 11, 2020    (JP) ................................. 2020-101452

(51) Int. Cl.
     *G01R 33/09*      (2006.01)

(52) U.S. Cl.
     CPC ......... *G01R 33/093* (2013.01); *G01R 33/096* (2013.01); *G01R 33/098* (2013.01)

(58) Field of Classification Search
     CPC .... G01B 7/004; G01C 17/38; G01R 33/0035; G01R 33/0017; G01R 33/34061;
(Continued)

(56) References Cited

U.S. PATENT DOCUMENTS

| | | |
|---|---|---|
| 2008/0032423 A1 | 2/2008 | Wang et al. |
| 2011/0297909 A1 | 12/2011 | Fukami et al. |

(Continued)

FOREIGN PATENT DOCUMENTS

| | | |
|---|---|---|
| JP | 2013533646 A | 8/2013 |
| JP | 5579218 B2 | 8/2014 |

(Continued)

OTHER PUBLICATIONS

Antos et al., "Magnetic Vortex Dynamics," Journal of the Physical Society of Japan, Mar. 2008, vol. 77, No. 3, 8 pages.

(Continued)

*Primary Examiner* — Jermele M Hollington
*Assistant Examiner* — Taqi R Nasir
(74) *Attorney, Agent, or Firm* — Keating & Bennett, LLP

(57) ABSTRACT

A magnetic sensor chip includes a substrate including a first main surface, and a magnetoresistive element having a magnetosensitive direction parallel or substantially parallel to the first main surface. The magnetoresistive element includes a reference layer, an intermediate layer, and a free layer stacked in a stacking direction perpendicular or substantially perpendicular to the first main surface. A direction of magnetic anisotropy of the free layer where no external magnetic field acts on the magnetic sensor chip is parallel or substantially parallel to the stacking direction and perpendicular or substantially perpendicular to the magnetosensitive direction. When a stress acts on the substrate predominantly in a first direction parallel or substantially parallel to the first main surface, a direction of stress-induced magnetic anisotropy in the free layer is perpendicular or substantially perpendicular to the magnetosensitive direction and the stacking direction.

20 Claims, 14 Drawing Sheets

(58) Field of Classification Search
CPC .. G01R 33/093; G01R 33/096; G01R 33/098; G06F 3/017; G06F 3/0346; G06F 3/012; A61B 34/20; A61B 2034/2051; G02B 27/017
See application file for complete search history.

(56) References Cited

U.S. PATENT DOCUMENTS

| | | | |
|---|---|---|---|
| 2012/0039119 | A1 | 2/2012 | Apalkov |
| 2013/0255069 | A1* | 10/2013 | Higashi ............... G01L 9/0048 29/595 |
| 2014/0010004 | A1 | 1/2014 | Suzuki |
| 2016/0363635 | A1* | 12/2016 | Wang .................... B82Y 25/00 |
| 2018/0003781 | A1* | 1/2018 | Bandiera ............. G11C 11/1675 |
| 2018/0058965 | A1 | 3/2018 | Yuzawa et al. |

FOREIGN PATENT DOCUMENTS

| JP | 2014240847 A | 12/2014 |
|---|---|---|
| JP | 6200565 B2 | 9/2017 |
| JP | 2018503824 A | 2/2018 |
| JP | 2018033007 A | 3/2018 |
| WO | 2010087389 A1 | 8/2010 |
| WO | 2012127722 A1 | 9/2012 |

OTHER PUBLICATIONS

International Search Report in PCT/JP2021/001868, mailed Apr. 6, 2021, 4 pages.

Nakano et al., "Magnetic-sensor performance evaluated from magneto-conductance curve in magnetic tunnel junctions using in-plane or perpendicularly magnetized synthetic antiferromagnetic reference layers," AIP Advances, 2018, vol. 8, 7 pages.

Weitensfelder et al., "Noise Characterization of Vortex-State GMR Sensors with Different Free Layer Thicknesses," Proceedings, 2018, vol. 2, No. 1013, 4 pages.

Written Opinion in PCT/JP2021/001868, mailed Apr. 6, 2021, 4 pages.

* cited by examiner

FIG.7
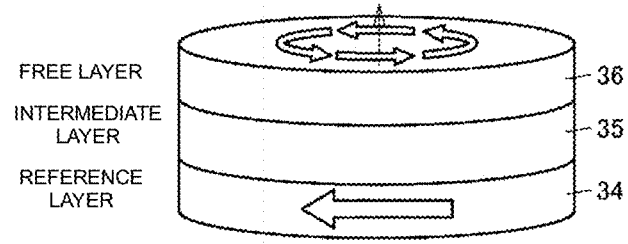
FIG.8
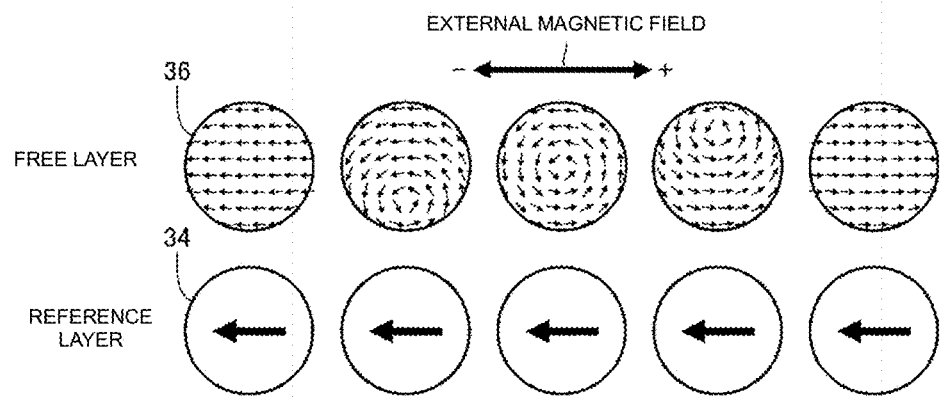
FIG.9

FIG.20 WHEN STRESS DECREASES DUE TO CHANGE WITH TIME

| | STRESS | MAGNETOSTRICTION CONSTANT | BIAS OF ANISOTROPY | STRESS-INDUCED MAGNETIC ANISOTROPY | SENSITIVITY (STRESS LARGE) | SENSITIVITY (STRESS SMALL) | SENSITIVITY VARIATION (STRESS LARGE → SMALL) | OFFSET (STRESS LARGE) | OFFSET (STRESS SMALL) | OFFSET VARIATION (STRESS LARGE → SMALL) |
|---|---|---|---|---|---|---|---|---|---|---|
| COMPARATIVE EXAMPLE 1 | TENSILE/MAGNETOSENSITIVE DIRECTION ← → | POSITIVE | No | ANISOTROPY/MAGNETOSENSITIVE DIRECTION ↔ | ++ | + | − | No | No | No |
| COMPARATIVE EXAMPLE 2 | | | → | ANISOTROPY/MAGNETOSENSITIVE DIRECTION → | ++ | + | − | ++ | + | − |
| COMPARATIVE EXAMPLE 3 | | | ← | ANISOTROPY/MAGNETOSENSITIVE DIRECTION ← | ++ | + | − | −−− | − | + |
| EXAMPLE 1 | DIRECTION OF MAGNETIC ANISOTROPY OF FREE LAYER ⊙ MAGNETOSENSITIVE DIRECTION | NEGATIVE | No | ANISOTROPY ⊥ MAGNETOSENSITIVE DIRECTION ↕ | −−− | − | + | No | No | No |
| EXAMPLE 2 | | | ↑ | ANISOTROPY ⊥ MAGNETOSENSITIVE DIRECTION ↑ | −−− | − | + | No | No | No |
| EXAMPLE 3 | | | ↓ | ANISOTROPY ⊥ MAGNETOSENSITIVE DIRECTION ↓ | −−− | − | + | No | No | No |
| EXAMPLE 4 | DIRECTION OF MAGNETIC ANISOTROPY OF FREE LAYER ⊙ MAGNETOSENSITIVE DIRECTION COMPRESSION/MAGNETOSENSITIVE DIRECTION | POSITIVE | No | ANISOTROPY ⊥ MAGNETOSENSITIVE DIRECTION ↕ | −−− | − | + | No | No | No |
| EXAMPLE 5 | | | ↑ | ANISOTROPY ⊥ MAGNETOSENSITIVE DIRECTION ↑ | −−− | − | + | No | No | No |
| EXAMPLE 6 | | | ↓ | ANISOTROPY ⊥ MAGNETOSENSITIVE DIRECTION ↓ | −−− | − | + | No | No | No |
| COMPARATIVE EXAMPLE 4 | → ← | NEGATIVE | No | ANISOTROPY/MAGNETOSENSITIVE DIRECTION ↔ | ++ | + | − | No | No | No |
| COMPARATIVE EXAMPLE 5 | | | → | ANISOTROPY/MAGNETOSENSITIVE DIRECTION → | ++ | + | − | ++ | + | − |
| COMPARATIVE EXAMPLE 6 | | | ← | ANISOTROPY/MAGNETOSENSITIVE DIRECTION ← | ++ | + | − | −−− | − | + |

FIG.21 WHEN STRESS INCREASES DUE TO CHANGE WITH TIME

| | STRESS | MAGNETOSTRICTION CONSTANT | BIAS OF ANISOTROPY | STRESS-INDUCED MAGNETIC ANISOTROPY | SENSITIVITY (STRESS LARGE) | SENSITIVITY (STRESS SMALL) | SENSITIVITY VARIATION (STRESS LARGE → SMALL) | OFFSET (STRESS LARGE) | OFFSET (STRESS SMALL) | OFFSET VARIATION (STRESS LARGE → SMALL) |
|---|---|---|---|---|---|---|---|---|---|---|
| COMPARATIVE EXAMPLE 1 | TENSILE/MAGNETOSENSITIVE DIRECTION ← → | POSITIVE | No | ANISOTROPY//MAGNETOSENSITIVE DIRECTION ← → | + | ++ | + | No | No | No |
| COMPARATIVE EXAMPLE 2 | | | → | ANISOTROPY//MAGNETOSENSITIVE DIRECTION → | + | ++ | + | + | ++ | + |
| COMPARATIVE EXAMPLE 3 | | | ← | ANISOTROPY//MAGNETOSENSITIVE DIRECTION ← | + | ++ | + | − | −− | − |
| EXAMPLE 1 | DIRECTION OF MAGNETIC ANISOTROPY OF FREE LAYER ↕ MAGNETOSENSITIVE DIRECTION | NEGATIVE | No | ANISOTROPY ⊥ MAGNETOSENSITIVE DIRECTION ↕ | − | −− | − | No | No | No |
| EXAMPLE 2 | | | ↑ | ANISOTROPY ⊥ MAGNETOSENSITIVE DIRECTION ↑ | − | −− | − | No | No | No |
| EXAMPLE 3 | | | ↓ | ANISOTROPY ⊥ MAGNETOSENSITIVE DIRECTION ↓ | − | −− | − | No | No | No |
| EXAMPLE 4 | DIRECTION OF MAGNETIC ANISOTROPY OF FREE LAYER ↕ MAGNETOSENSITIVE DIRECTION | POSITIVE | No | ANISOTROPY ⊥ MAGNETOSENSITIVE DIRECTION ↕ | − | −− | − | No | No | No |
| EXAMPLE 5 | | | ↑ | ANISOTROPY ⊥ MAGNETOSENSITIVE DIRECTION ↑ | − | −− | − | No | No | No |
| EXAMPLE 6 | | | ↓ | ANISOTROPY ⊥ MAGNETOSENSITIVE DIRECTION ↓ | − | −− | − | No | No | No |
| COMPARATIVE EXAMPLE 4 | COMPRESSION/MAGNETOSENSITIVE DIRECTION → ← | NEGATIVE | No | ANISOTROPY//MAGNETOSENSITIVE DIRECTION ← → | + | ++ | + | No | No | No |
| COMPARATIVE EXAMPLE 5 | | | → | ANISOTROPY//MAGNETOSENSITIVE DIRECTION → | + | ++ | + | + | ++ | + |
| COMPARATIVE EXAMPLE 6 | | | ← | ANISOTROPY//MAGNETOSENSITIVE DIRECTION ← | + | ++ | + | − | −− | − |

FIG.22 WHEN STRESS DECREASES DUE TO CHANGE WITH TIME

FIG.23 WHEN STRESS INCREASES DUE TO CHANGE WITH TIME

MAGNETIC SENSOR CHIP AND MAGNETIC SENSOR DEVICE

CROSS REFERENCE TO RELATED APPLICATIONS

This application claims the benefit of priority to Japanese Patent Application No. 2020-101452 filed on Jun. 11, 2020 and is a Continuation Applications of PCT Application No. PCT/JP2021/001868 filed on Jan. 20, 2021. The entire contents of each application are hereby incorporated herein by reference.

BACKGROUND OF THE INVENTION

1. Field of the Invention

The present disclosure relates to a magnetic sensor chip that detects an external magnetic field, and a magnetic sensor device including the same.

2. Description of the Related Art

In recent years, a magnetoresistive element using a magnetic vortex structure that makes a special response to a magnetic field has been developed.

R. Antos, Y. Otani and J. Shibata, "Magnetic vortex dynamics", J. Phys. Soc. Jpn. 77, 031004 (2008) discloses that a magnetic vortex structure develops in a submicron scale disk of a ferromagnetic material. The magnetic structure is determined by competition among exchange energy, magnetostatic energy (shape anisotropy), Zeeman energy, and various magnetic anisotropy energies.

In the magnetic vortex structure, the spins aligned in the radial direction in the disk surface are arranged parallel to each other, but the spins are directed in the vertical direction at the center (core) of the circle. In the hysteresis loop of the magnetoresistive element having the magnetic vortex structure, a linear region appears in a portion of the magnetization curve.

H. Weitensfelder et al., "Noise Characterization of Vortex-State GMR Sensors with Different Free Layer Thicknesses", Proceedings 2, 2013 (2018) discloses a technique for enlarging a linear region and reducing sensitivity by increasing a film thickness of a free layer (disk aspect ratio=film thickness of free layer/disk diameter) in a giant magnetoresistive (GMR) sensor using a vortex magnetized layer in the free layer.

In addition, as a bias method capable of obtaining an effect equivalent to a case where a bias magnetic field is applied not to the element plane but in a direction perpendicular to the element plane, use of a perpendicular magnetization film for the free layer can be described. Specifically, it is known that CoFeB on MgO develops perpendicular magnetic anisotropy due to orbital hybridization between the 3d orbital of Fe atoms and the 2p orbital of O atoms at the interface.

T. Nakano et al., "Magnetic-sensor performance evaluated from magneto-conductance curve in magnetic tunnel junctions using in-plane or perpendicularly magnetized synthetic antiferromagnetic reference layers", AIP Advances 8, 045011 (2018) discloses a technique in which a free layer of a tunnel magnetoresistive (TMR) sensor is formed as a perpendicular magnetization film using the above-described phenomenon, thereby enlarging a linear region and reducing sensitivity.

However, in R. Antos, Y. Otani and J. Shibata, "Magnetic vortex dynamics", J. Phys. Soc. Jpn. 77, 031004 (2008), H. Weitensfelder et al., "Noise Characterization of Vortex-State GMR Sensors with Different Free Layer Thicknesses", Proceedings 2, 2013 (2018) and T. Nakano et al., "Magnetic-sensor performance evaluated from magneto-conductance curve in magnetic tunnel junctions using in-plane or perpendicularly magnetized synthetic antiferromagnetic reference layers", AIP Advances 8, 045011 (2018), the stress-induced magnetic anisotropy that develops in the magnetoresistive element when a stress acts on the substrate on which the magnetoresistive element is formed is not sufficiently considered.

In the case where no consideration is given to the stress-induced magnetic anisotropy, there is a concern that an offset voltage varies when a stress is input to the magnetoresistive element from the outside or the stress acting on the magnetoresistive element changes due to a change over time.

SUMMARY OF THE INVENTION

Preferred embodiments of the present invention provide magnetic sensor chips and magnetic sensor devices that are each able to improve reliability with respect to stress variation.

A magnetic sensor chip according to a preferred embodiment of the present invention detects an external magnetic field. The magnetic sensor chip includes a substrate including a first main surface, and a magnetoresistive element on the first main surface and having a predetermined magnetosensitive direction parallel or substantially parallel to the first main surface. The magnetoresistive element includes a reference layer in which a magnetization direction is fixed, a free layer in which a magnetization direction is changed by an external magnetic field, and an intermediate layer interposed between the reference layer and the free layer. The reference layer, the intermediate layer, and the free layer are stacked in a stacking direction perpendicular or substantially perpendicular to the first main surface. A direction of magnetic anisotropy of the free layer in a state in which no external magnetic field acts on the magnetic sensor chip is parallel or substantially parallel to the stacking direction and perpendicular or substantially perpendicular to the magnetosensitive direction. When a stress acts on the substrate predominantly in a first direction parallel or substantially parallel to the first main surface, a direction of stress-induced magnetic anisotropy that develops in the free layer is perpendicular or substantially perpendicular to the magnetosensitive direction and the stacking direction.

In a magnetic sensor chip according to a preferred embodiment of the present invention, the free layer may have a positive magnetostriction constant. Further, a compressive stress may act on the substrate in the first direction. In this case, the first direction is preferably parallel or substantially parallel to the magnetosensitive direction and perpendicular or substantially perpendicular to the stacking direction.

In a magnetic sensor chip according to a preferred embodiment of the present invention, the free layer may have a negative magnetostriction constant. In addition, a tensile stress may act on the substrate in the first direction. In this case, the first direction is preferably parallel or substantially parallel to the magnetosensitive direction and perpendicular or substantially perpendicular to the stacking direction.

In a magnetic sensor chip according to a preferred embodiment of the present invention, the substrate may have a longitudinal shape extending in a longitudinal direction. In this case, the longitudinal direction may be parallel or substantially parallel to the first direction and parallel or substantially parallel to the magnetosensitive direction.

In a magnetic sensor chip according to a preferred embodiment of the present invention, the free layer may have a negative magnetostriction constant. Further, a compressive stress may act on the substrate in the first direction. In this case, the first direction may be perpendicular or substantially perpendicular to the magnetosensitive direction and perpendicular or substantially perpendicular to the stacking direction.

In a magnetic sensor chip according to a preferred embodiment of the present invention, the free layer may have a positive magnetostriction constant. In addition, a tensile stress may act on the substrate in the first direction. In this case, the first direction may be perpendicular or substantially perpendicular to the magnetosensitive direction and perpendicular or substantially perpendicular to the stacking direction.

In a magnetic sensor chip according to a preferred embodiment of the present invention, the substrate may have a longitudinal shape extending in a longitudinal direction. In this case, the longitudinal direction may be parallel or substantially parallel to the first direction and perpendicular or substantially perpendicular to the magnetosensitive direction.

In a magnetic sensor chip according to a preferred embodiment of the present invention, the free layer may have a magnetic vortex structure magnetized in a vortex shape around an axis perpendicular or substantially perpendicular to a film surface.

In a magnetic sensor chip according to a preferred embodiment of the present invention, the free layer may have a disk shape.

In a magnetic sensor chip according to a preferred embodiment of the present invention, the free layer may include a perpendicular magnetization film.

In a magnetic sensor chip according to a preferred embodiment of the present invention, the magnetoresistive element may include a TMR element.

In a magnetic sensor chip according to a preferred embodiment of the present invention, the magnetoresistive element may include a giant magnetoresistive (GMR) element.

In a magnetic sensor chip according to a preferred embodiment of the present invention, the magnetoresistive element may include a first magnetoresistive element and a second magnetoresistive element defining a half-bridge circuit.

In a magnetic sensor chip according to a preferred embodiment of the present invention, the magnetoresistive element may include a first magnetoresistive element and a second magnetoresistive element defining a first half-bridge circuit, and a third magnetoresistive element and a fourth magnetoresistive element defining a second half-bridge circuit. In this case, the first half-bridge circuit and the second half-bridge circuit may define a full-bridge circuit.

A magnetic sensor device according to a preferred embodiment of the present invention includes a magnetic sensor chip according to a preferred embodiment of the present invention and a mounting substrate on which the magnetic sensor is mounted.

A magnetic sensor device according to a preferred embodiment of the present invention includes a magnetic sensor chip according to a preferred embodiment of the present invention, a mounting substrate on which the magnetic sensor is mounted, and a sealing resin that molds the magnetic sensor chip. A thermal expansion coefficient of the substrate in the magnetic sensor chip is different from a thermal expansion coefficient of the mold resin.

A magnetic sensor device according to a preferred embodiment of the present invention includes a magnetic sensor chip according to a preferred embodiment of the present invention and a mounting substrate on which the magnetic sensor is mounted. A structure having a thermal expansion coefficient larger than that of the substrate is not arranged around the first main surface.

According to preferred embodiments of the present invention, it is possible to provide magnetic sensor chips and magnetic sensor devices that are each able to improve reliability with respect to stress variation.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a perspective view schematically illustrating a stacked structure of a reference layer, an intermediate layer, and a free layer, and magnetization directions of the free layer and the reference layer in the magnetoresistive element portion illustrated in FIG. 6.

FIG. 8 is a plan view illustrating a state in which magnetization of a free layer is changed by an external magnetic field in the magnetoresistive element portion illustrated in FIG. 6.

FIG. 9 is a schematic cross-sectional view illustrating a stacked structure of a magnetoresistive element portion included in a magnetic sensor chip according to Preferred Embodiment 2 of the present invention.

FIG. 20 is a diagram qualitatively illustrating a first evaluation result in a case where the longitudinal direction of the substrate and the magnetosensitive direction are parallel or substantially parallel to each other in the magnetic sensor chip and the stress acting on the substrate decreases with time.

FIG. 21 is a diagram qualitatively illustrating a second evaluation result in a case where the longitudinal direction of the substrate and the magnetosensitive direction in the magnetic sensor chip are parallel or substantially parallel to each other and the stress acting on the substrate increases with time.

FIG. 22 is a diagram qualitatively illustrating a third evaluation result in a case where the longitudinal direction of the substrate and the magnetosensitive direction in the magnetic sensor chip are perpendicular or substantially perpendicular to each other and the stress acting on the substrate decreases with time.

FIG. 23 is a diagram qualitatively illustrating a fourth evaluation result in a case where the longitudinal direction of the substrate and the magnetosensitive direction in the magnetic sensor chip are perpendicular or substantially perpendicular to each other and the stress acting on the substrate increases with time.

DETAILED DESCRIPTION OF THE PREFERRED EMBODIMENTS

Figure 1:
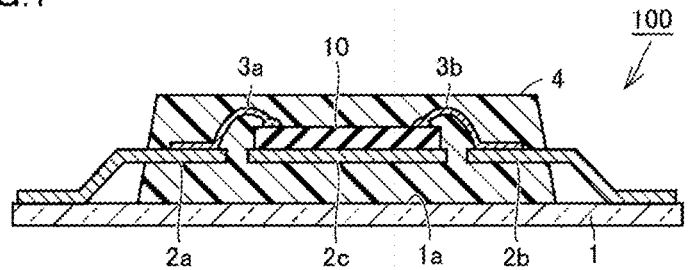
FIG. 1 is a diagram illustrating a magnetic sensor device including a magnetic sensor chip according to Preferred Embodiment 1 of the present invention.

Hereinafter, preferred embodiments of the present disclosure will be described in detail with reference to the drawings. In the preferred embodiments described below, the same or common portions are denoted by the same reference numerals in the drawings, and description thereof will not be repeated.

Preferred Embodiment 1

Figure 2:
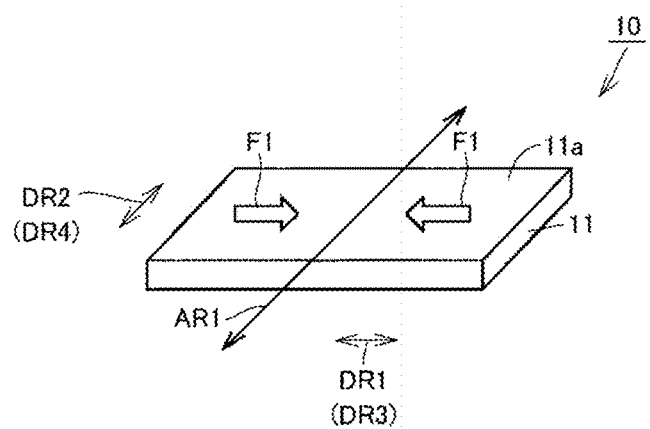
FIG. 2 is a diagram illustrating a stress acting on the magnetic sensor chip according to Preferred Embodiment 1 of the present invention and stress-induced magnetic anisotropy developed by the stress.

FIG. 1 is a diagram illustrating a magnetic sensor device including a magnetic sensor chip according to Preferred Embodiment 1 of the present invention. FIG. 2 is a diagram illustrating a stress acting on the magnetic sensor chip according to Preferred Embodiment 1 and stress-induced magnetic anisotropy developed by the stress.

As illustrated in FIG. 1, a magnetic sensor device 100 according to Preferred Embodiment 1 includes a mounting substrate 1, a first lead frame 2a, a second lead frame 2b, a support frame 2c, bonding wires 3a and 3b, a sealing resin 4, and a magnetic sensor chip 10.

The magnetic sensor chip 10 is supported by the support frame 2c. To be more specific, the magnetic sensor chip 10 is supported by the support frame 2c such that a first main surface 11a (see FIG. 2) of a substrate 11 (see FIG. 2) on which a magnetoresistive element portion described later is provided faces a side opposite to a side on which the mounting substrate 1 is positioned.

One end side of the magnetic sensor chip 10 is electrically connected to the first lead frame 2a by the bonding wire 3a. The other end side of the magnetic sensor chip 10 is electrically connected to the second lead frame 2b by the bonding wire 3b.

The magnetic sensor chip 10 is molded with the sealing resin 4. To be specific, the magnetic sensor chip 10 is supported by the support frame 2c and is molded by the sealing resin 4 in a state of being electrically connected to the first lead frame 2a and the second lead frame 2b. The sealing resin 4 is provided on the mounting substrate 1.

A tip portion of the first lead frames 2a exposed to the outside from the sealing resins 4 is electrically connected to a terminal electrode provided on the mounting substrate 1. Similarly, a tip portion of the second lead frames 2b exposed to the outside from the sealing resin 4 is electrically connected to another terminal electrode provided on the mounting substrate 1.

As illustrated in FIG. 2, the magnetic sensor chip 10 has a longitudinal shape having a longitudinal direction (DR1 direction) and a lateral direction (DR2 direction) in a plan view. More specifically, the magnetic sensor chip 10 has a rectangular or substantially rectangular shape extending in the longitudinal direction in a plan view.

The magnetic sensor chip 10 includes a substrate 11 and a magnetoresistive element portion described later. The magnetic sensor chip 10 can detect an external magnetic field by the magnetoresistive element portion. The magnetic sensor chip 10 has a magnetosensitive direction (DR3 direction) parallel or substantially parallel to the longitudinal direction (DR1 direction).

In the magnetic sensor chip 10, a stress acts on the substrate 11 so as to be predominantly in a first direction parallel or substantially parallel to the first main surface 11a of the substrate 11. Specifically, the first direction is parallel or substantially parallel to the longitudinal direction and also parallel or substantially parallel to the magnetosensitive direction. A compressive stress F1 acts on the substrate 11 as a stress acting in the first direction.

The magnetic sensor chip 10 is molded so that an initial stress acts in a direction parallel or substantially parallel to the first direction (more specifically, the longitudinal direction) due to a difference between a thermal expansion coefficient of the substrate 11 and a thermal expansion coefficient of the sealing resin 4. The magnetic sensor chip 10 is molded in this manner, such that the direction of the initial stress and the direction in which the stress varies due to the usage in a state of being exposed to an environmental temperature are predominantly the direction parallel or substantially parallel to the first direction (more specifically, the longitudinal direction). The factor for applying the initial stress in the direction parallel or substantially parallel to the first direction is not limited to the above-described thermal expansion coefficient, and can be appropriately selected. For example, the factor includes an internal stress due to residual stress of the material itself.

By making the thermal expansion coefficient of the sealing resin 4 larger than that of the substrate 11, it is possible to apply the compressive stress F1 as described above. Furthermore, by making the thermal expansion coefficient of each of the first lead frame 2a, the second lead frame 2b, the support frame 2c, and the mounting substrate 1 larger than the thermal expansion coefficient of the substrate 11, the compressive stress F1 can be applied more reliably.

As will be described later, a free layer 36 (see FIGS. 6 and 7) included in the magnetoresistive element portion has a positive magnetostriction constant. Thus, in a state in which the compressive stress acts on the substrate 11 in the first direction parallel or substantially parallel to the longitudinal direction, the stress-induced magnetic anisotropy develops in the free layer 36 in a direction perpendicular or substantially perpendicular to the magnetosensitive direction as indicated by an arrow AR1.

Also in the structures of mounting the magnetic sensor chip 10 on the mounting substrate 1 as in the following Modification 1 and Modification 2 of a preferred embodiment of the present invention, as in Preferred Embodiment 1 described above, the direction of the initial stress and the direction in which the stress varies due to the usage in a state of being exposed to the environmental temperature are predominantly the direction parallel or substantially parallel to the first direction (more specifically, the longitudinal direction).

Figure 3:
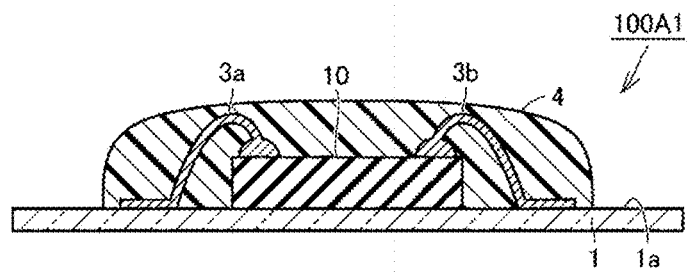
FIG. 3 is a diagram illustrating a magnetic sensor device according to Modification 1 of a preferred embodiment of the present invention.

FIG. 3 is a diagram illustrating a magnetic sensor device according to Modification 1. As illustrated in FIG. 3, a magnetic sensor device 100A1 according to Modification 1 includes the mounting substrate 1, the bonding wires 3a and 3b, the sealing resin 4, and the magnetic sensor chip 10.

The magnetic sensor chip 10 is fixed to a mounting surface 1a of the mounting substrate 1. To be more specific, the magnetic sensor chip 10 is fixed to the mounting surface 1a such that the first main surface 11a of the substrate 11 on which the magnetoresistive element portion is provided faces the side opposite to the side where the mounting substrate 1 is positioned.

One end side of the magnetic sensor chip 10 is electrically connected by the bonding wire 3a to a terminal electrode provided on the mounting surface 1a. The other end side of the magnetic sensor chip 10 is electrically connected by the bonding wire 3b to another terminal electrode provided on the mounting surface 1a.

The magnetic sensor chip 10 is molded on the mounting surface 1a by the sealing resin 4. Also in this case, the thermal expansion coefficient of the sealing resin 4 is different from that of the substrate 11 included in the magnetic sensor chip 10. Specifically, the thermal expansion coefficient of the sealing resin 4 is larger than that of the substrate 11. In addition, the thermal expansion coefficient of the mounting substrate 1 is also larger than that of the substrate 11.

Even when the magnetic sensor chip 10 is mounted on the mounting substrate 1 as described above, the direction of the initial stress acting on the substrate 11 and the direction in which the stress varies due to the usage in a state of being exposed to the environmental temperature are predominantly the direction parallel or substantially parallel to the first direction (more specifically, the longitudinal direction).

Figure 4:
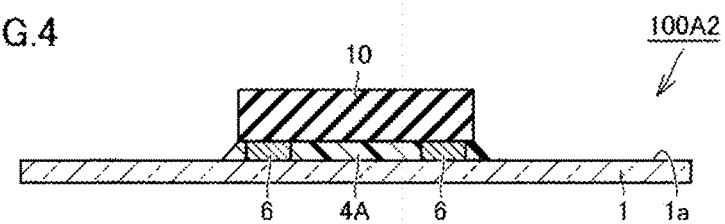
FIG. 4 is a diagram illustrating a magnetic sensor device according to Modification 2 of a preferred embodiment of the present invention.

FIG. 4 is a diagram illustrating a magnetic sensor device according to Modification 2. As illustrated in FIG. 4, a magnetic sensor device 100A2 according to Modification 2 includes the mounting substrate 1, a conductive member 6, an underfill 4A, and the magnetic sensor chip 10.

The magnetic sensor chip 10 is electrically connected to a terminal electrode provided on the mounting substrate 1 by the conductive member 6. The conductive member 6 is made of, for example, a member having conductivity such as a conductive paste. The magnetic sensor chip 10 is arranged such that the first main surface 11a of the substrate 11 on which the magnetoresistive element portion is provided faces the mounting substrate 1.

The underfill 4A is filled between the magnetic sensor chip 10 and the mounting substrate 1. The underfill 4A is made of resin such as, for example, silicone resin and epoxy resin.

Also in this case, the thermal expansion coefficient of the underfill 4A is different from that of the substrate 11 included in the magnetic sensor chip 10. To be specific, the thermal expansion coefficient of the underfill 4A is larger than that of the substrate 11. In addition, the thermal expansion coefficient of the mounting substrate 1 is also larger than that of the substrate 11.

Even when the magnetic sensor chip 10 is mounted on the mounting substrate 1 as described above, the direction of the initial stress acting on the substrate 11 and the direction in which the stress varies due to the usage in a state of being exposed to the environmental temperature are predominantly the direction parallel or substantially parallel to the first direction (more specifically, the longitudinal direction).

Figure 5:
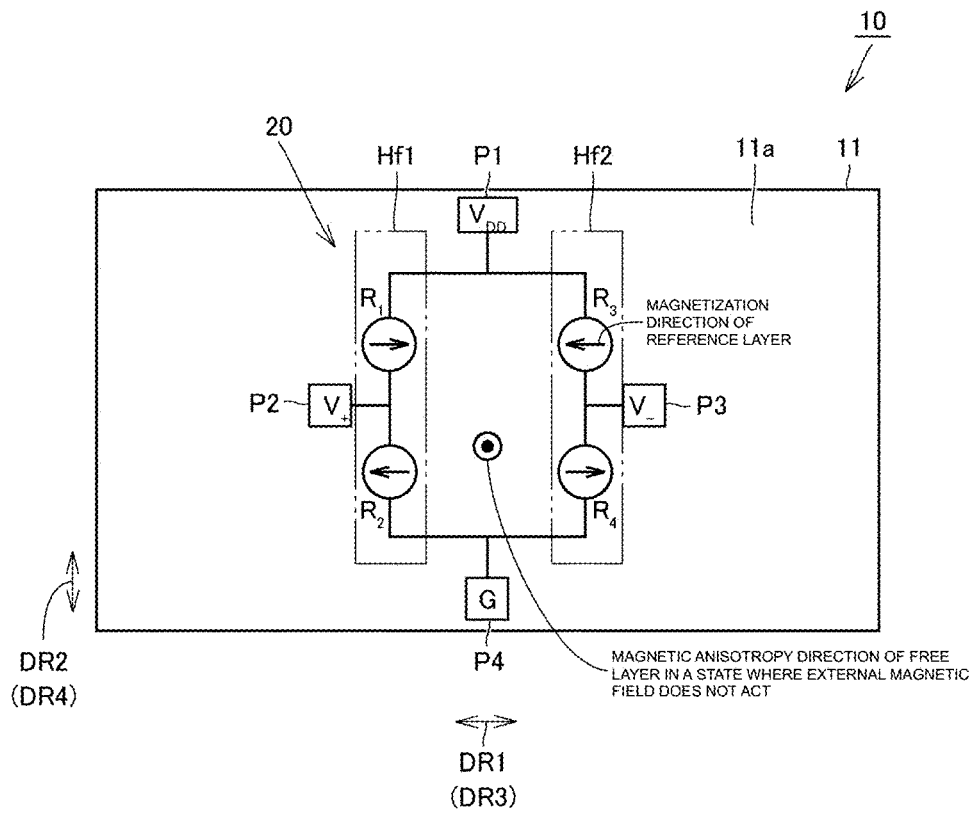
FIG. 5 is a schematic plan view illustrating the magnetic sensor chip according to Preferred Embodiment 1 of the present invention.

FIG. 5 is a schematic plan view illustrating the magnetic sensor chip according to Preferred Embodiment 1. The magnetic sensor chip 10 will be described in detail with reference to FIG. 5.

The magnetic sensor chip 10 includes the substrate 11 including the first main surface 11a, and a magnetoresistive element portion 20. The magnetoresistive element portion 20 is provided on the first main surface 11a so as to have a predetermined magnetosensitive direction (DR3 direction) parallel or substantially parallel to the first main surface 11a. To be specific, as described above, the magnetosensitive direction is parallel or substantially parallel to the longitudinal direction (DR1 direction) of the substrate 11. The magnetosensitive direction is determined by the direction of magnetization of a reference layer 34 described later. The magnetosensitive direction is a direction of about ±30 degrees with respect to the magnetization direction of the reference layer 34, and is preferably parallel or substantially parallel to the magnetization direction of the reference layer 34. Since the magnetosensitive direction is parallel or substantially parallel to the magnetization direction of the reference layer 34, the external magnetic field can be detected with high accuracy.

The magnetoresistive element portion 20 includes a first magnetoresistive element portion R1, a second magnetoresistive element portion R2, a third magnetoresistive element portion R3, and a fourth magnetoresistive element portion R4. The first magnetoresistive element portion R1, the second magnetoresistive element portion R2, the third magnetoresistive element portion R3, and the fourth magnetoresistive element portion R4 define a full-bridge circuit.

To be specific, one side of the first magnetoresistive element portion R1 is connected to an electrode portion P1 for applying a power supply voltage Vdd. The other side of the first magnetoresistive element portion R1 is connected to an electrode portion P2 for taking out an output voltage V+.

One side of the second magnetoresistive element portion R2 is connected to the electrode portion P2 for taking out the output voltage V+. The other side of the second magnetoresistive element portion R2 is connected to an electrode portion P4 serving as a ground electrode.

One side of the third magnetoresistive element portion R3 is connected to the electrode portion P1 for applying the power supply voltage Vdd. The other side of the third magnetoresistive element portion R3 is connected to an electrode portion P3 for taking out an output voltage V−.

One side of the fourth magnetoresistive element portion R4 is connected to the electrode portion P3 for taking out the output voltage V−. The other side of the fourth magnetoresistive element portion R4 is connected to the electrode portion P4 serving as a ground electrode.

The first magnetoresistive element portion R1 and the second magnetoresistive element portion R2 are connected in series to thus define a first half-bridge circuit Hf1. The third magnetoresistive element portion R3 and the fourth magnetoresistive element portion R4 are connected in series to thus define a second half-bridge circuit Hf2.

The first half-bridge circuit Hf1 and the second half-bridge circuit Hf2 are connected in parallel to thus define a full-bridge circuit.

When the power supply voltage Vdd is applied between the electrode portion P1 and electrode portion P4, the output voltages V+ and V− are taken out from the electrode portion P2 and the electrode portion P3 depending on the intensity of the external magnetic field. The output voltages V+ and V− are differentially amplified via a differential amplifier (not illustrated).

Each of the first magnetoresistive element portion R1, the second magnetoresistive element portion R2, the third magnetoresistive element portion R3, and the fourth magnetoresistive element portion R4 includes a single or a plurality of unit elements. The unit element is, for example, a TMR element. That is, each of the first magnetoresistive element portion R1, the second magnetoresistive element portion R2, the third magnetoresistive element portion R3, and the fourth magnetoresistive element portion R4 is defined by the TMR element, for example.

As will be described later, the unit element includes the free layer 36, an intermediate layer 35, and the reference layer 34. In FIG. 5, the magnetization directions of the reference layers 34 included in the first magnetoresistive element portion R1, the second magnetoresistive element portion R2, the third magnetoresistive element portion R3, and the fourth magnetoresistive element portion R4 are indicated by arrows.

The magnetization directions of the reference layers 34 included in the first magnetoresistive element portion R1, the second magnetoresistive element portion R2, the third magnetoresistive element portion R3, and the fourth magnetoresistive element portion R4 are parallel or substantially parallel to the longitudinal direction of the substrate 11.

In the first magnetoresistive element portion R1 and the second magnetoresistive element portion R2 defining the first half-bridge circuit Hf1, the magnetization direction of the reference layer 34 in the first magnetoresistive element portion R1 and the magnetization direction of the reference layer 34 in the second magnetoresistive element portion R2 are opposite to each other.

Similarly, in the third magnetoresistive element portion R3 and the fourth magnetoresistive element portion R4 defining the second half-bridge circuit Hf2, the magnetization direction of the reference layer 34 in the third magnetoresistive element portion R3 and the magnetization direction of the reference layer 34 in the fourth magnetoresistive element portion R4 are opposite to each other.

In addition, the magnetization direction of the reference layer 34 of the first magnetoresistive element portion R1 in the first half-bridge circuit Hf1 is the same or substantially the same as the magnetization direction of the reference layer 34 of the fourth magnetoresistive element portion R4 in the second half-bridge circuit Hf2.

Similarly, the magnetization direction of the reference layer 34 of the second magnetoresistive element portion R2 in the first half-bridge circuit Hf1 is the same or substantially the same as the magnetization direction of the reference layer 34 of the third magnetoresistive element portion R3 in the second half-bridge circuit Hf2.

Figure 6:
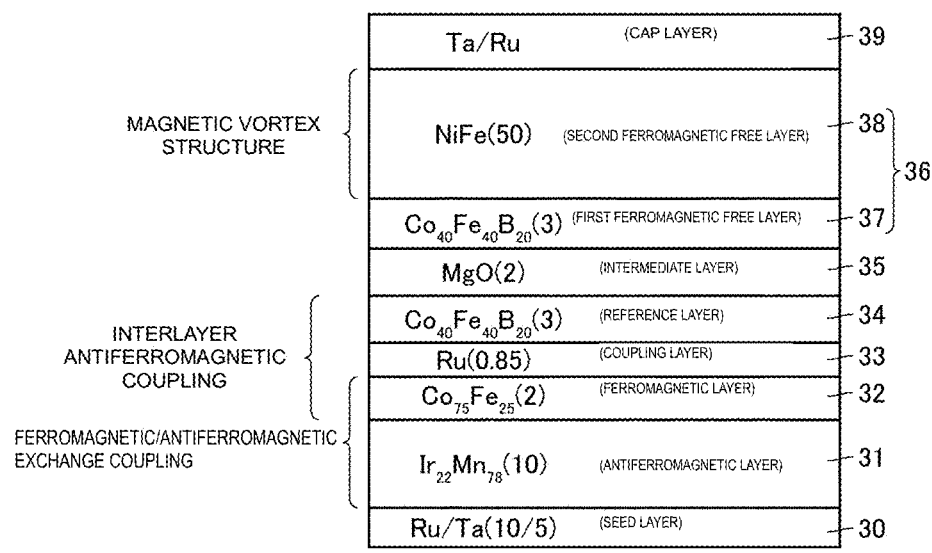
FIG. 6 is a schematic cross-sectional view illustrating a stacked structure of a magnetoresistive element portion included in the magnetic sensor chip according to Preferred Embodiment 1 of the present invention.

FIG. 6 is a schematic cross-sectional view illustrating a stacked structure of a magnetoresistive element portion included in the magnetic sensor chip according to Preferred Embodiment 1.

As illustrated in FIG. 6, the above-described unit element included in the magnetoresistive element portion includes a seed layer 30 as a lower electrode layer, an antiferromagnetic layer 31, a ferromagnetic layer 32, a coupling layer 33, the reference layer 34, the intermediate layer 35, the free layer 36, and a cap layer 39 as an upper electrode layer. These are stacked in order from the substrate 11 side.

The seed layer 30 is a layer for appropriately growing crystals of the antiferromagnetic layer 31. As the seed layer 30, for example, a stacked film of Ru and Ta can be used. As the seed layer 30, a single metal film made of another metal or alloy, or a laminate of a plurality of types of the metal films can be used.

The antiferromagnetic layer 31 is provided on the seed layer 30. For example, IrMn can be used as the antiferromagnetic layer 31. The antiferromagnetic layer 31 may be made of an alloy including Mn such as, for example, PtMn.

The ferromagnetic layer 32 is provided on the antiferromagnetic layer 31. For example, CoFe can be used as the ferromagnetic layer 32. The ferromagnetic layer 32 may be made of, for example, CoFeB or the like. The magnetization of the ferromagnetic layer 32 is fixed in a predetermined in-plane direction by an exchange coupling magnetic field acting on the stacking interface with the antiferromagnetic layer 31.

The coupling layer 33 is provided on the ferromagnetic layer 32. The coupling layer 33 is arranged between the ferromagnetic layer 32 and the reference layer 34, and causes synthetic anti-ferromagnetic (SAF) coupling between the ferromagnetic layer 32 and the reference layer 34.

The coupling layer 33 is made of a nonmagnetic layer. For example, Ru can be used as the coupling layer 33.

The reference layer 34 is provided on the coupling layer 33. The reference layer 34 is a ferromagnetic layer. For example, CoFeB can be used as the reference layer 34. The reference layer 34 may be made of, for example, CoFe or the like.

The ferromagnetic layer 32, the coupling layer 33, and the reference layer 34 described above define an SAF structure. Thus, the magnetization direction of the reference layer 34 can be firmly fixed.

The intermediate layer 35 is provided on the reference layer 34. The intermediate layer 35 is arranged between the reference layer 34 and the free layer 36. In a case where the intermediate layer 35 is an insulating layer, the intermediate layer 35 defines and functions as a tunnel barrier layer of TMR. The intermediate layer 35 is defined by an insulating layer. In this case, for example, MgO can be used as the intermediate layer 35.

The free layer 36 is provided on the intermediate layer 35. The free layer 36 includes a first ferromagnetic free layer and a second ferromagnetic free layer 38. The first ferromagnetic free layer 37 and the second ferromagnetic free layer 38 are stacked in order on the intermediate layer 35.

The first ferromagnetic free layer 37 is provided on the intermediate layer 35. For example, CoFeB can be used as the first ferromagnetic free layer 37.

The second ferromagnetic free layer 38 is provided on the first ferromagnetic free layer 37. For example, NiFe can be used as the second ferromagnetic free layer 38. By setting the composition of the second ferromagnetic free layer to, for example, Ni82.5Fe17.5, the magnetostriction constant of the free layer 36 can be set to a positive value. In this case, the magnetostriction constant of the free layer 36 is a positive value of equal to or less than about +1 ppm, for example.

The cap layer 39 is provided on the free layer 36. More specifically, the cap layer 39 is provided on the second ferromagnetic free layer 38. As the cap layer 39, for example, a stacked film of Ru and Ta can be used. As the cap layer 39, for example, a single metal film made of another metal or alloy or a laminate of a plurality of types of the metal films can be used.

As described above, the case where the unit element according to Preferred Embodiment 1 is a bottom-pinned type TMR element in which the reference layer 34 is arranged on the lower side of the free layer 36 has been described as an example, but the unit element is not limited thereto, and may be a top-pinned type TMR element in which the reference layer 34 is arranged on the upper side of the free layer 36.

In addition, the unit element is not limited to the TMR element, and may be a GMR element, for example. That is, each of the first magnetoresistive element portion R1, the second magnetoresistive element portion R2, the third magnetoresistive element portion R3, and the fourth magnetoresistive element portion R4 may be defined by a GMR element. In this case, a spacer layer is used as the intermediate layer 35 in place of the tunnel barrier layer. For example, Cu can be used as the spacer layer.

FIG. 7 is a perspective view schematically illustrating a stacked structure of a reference layer, an intermediate layer, and a free layer, and magnetization directions of the free layer and the reference layer in the magnetoresistive element portion illustrated in FIG. 6. FIG. 7 schematically illustrates the magnetization directions of the free layer and the reference layer in a state in which the external magnetic field is not applied to the magnetic sensor chip 10.

As illustrated in FIG. 7, the unit element has a disk shape, and thus each of the reference layer 34, the intermediate layer 35, and the free layer 36 also has a disk shape.

The magnetization of the reference layer 34 is fixed in a direction parallel or substantially parallel to a film surface of the reference layer 34. Specifically, the magnetization of the reference layer 34 is fixed in a direction parallel or substantially parallel to the longitudinal direction of the substrate 11.

The free layer 36 has a magnetic vortex structure magnetized in a vortex shape around an axis perpendicular or substantially perpendicular to the film surface of the free layer 36. Such a magnetic vortex structure can be developed by controlling the film thickness of the free layer and the disk diameter to an appropriate disk aspect ratio (film thickness of free layer/disk diameter).

In a case where no external magnetic field acts on the magnetic sensor chip 10, the center of the magnetic vortex is positioned at the center of the film surface. In this state, the direction of the magnetic anisotropy of the free layer 36 (i.e., total magnetization direction) is parallel or substantially parallel to the stacking direction of the reference layer 34, the intermediate layer 35, and the free layer 36, which is perpendicular or substantially perpendicular to the first main surface 11a.

As will be described later, in a case where the external magnetic field acts on the magnetic sensor chip 10, in the free layer 36, the center of the magnetization vortex moves depending on the intensity of the external magnetic field, and an area having magnetization in the same or substantially the same direction as the applied magnetic field becomes dominant.

FIG. 8 is a plan view illustrating a state in which the magnetization of the free layer is changed by the external magnetic field in the magnetoresistive element portion illustrated in FIG. 6. That is, FIG. 8 illustrates a change in the direction of the vertical magnetization of the free layer 36 in a case where the external magnetic field changes in a direction parallel or substantially parallel to the magnetosensitive direction.

In FIG. 8, one side of the magnetosensitive direction is defined as a positive direction (0° direction), and the other side of the magnetosensitive direction is defined as a negative direction (180° direction). As an example, FIG. 8 illustrates a case where the magnetization of the reference layer 34 is parallel or substantially parallel to the magnetosensitive direction as described above and is fixed so as to face the other side of the magnetosensitive direction.

In this case, the left side in FIG. 8 illustrates a case where the external magnetic field is large in the 180° direction (negative direction), the center in FIG. 8 illustrates a case where the external magnetic field does not act (is not applied), and the right side in FIG. 8 illustrates a case where the external magnetic field is large in the 0° direction (positive direction).

As illustrated in the center of FIG. 8, in a case where no external magnetic field acts, the center of the magnetic vortex in the free layer 36 is positioned at the center of the free layer 36.

As illustrated in the second row from the left in FIG. 8, when the external magnetic field acts in the negative direction, the center of the magnetic vortex in the free layer 36 moves from the center of the free layer 36 to one side (the lower side in FIG. 8) in the perpendicular direction perpendicular or substantially perpendicular to the magnetosensitive direction in the in-plane direction. Further, when the external magnetic field in the negative direction is increased, the magnetic flux density of the free layer 36 is saturated, and the magnetization of the free layer becomes parallel or substantially parallel to the fixed magnetization direction of the reference layer 34, as illustrated in the first row from the left in FIG. 8.

As illustrated in the fourth row from the left in FIG. 8, when the external magnetic field is applied in the positive direction, the center of the magnetic vortex in the free layer 36 moves from the center of the free layer 36 to the other side (upper side in FIG. 8) in the perpendicular direction perpendicular or substantially perpendicular to the magnetosensitive direction in the in-plane direction. Furthermore, when the external magnetic field in the positive direction is increased, the magnetic flux density of the free layer 36 is saturated, and the magnetization of the free layer 36 becomes antiparallel to the fixed magnetization direction of the reference layer 34, as illustrated in the fifth row from the left in FIG. 8.

As described above, since the direction of the magnetic anisotropy of the free layer 36 changes depending on the intensity of the external magnetic field, the magnetic sensor chip 10 can detect the external magnetic field.

In general, a magnetic sensor device is subjected to a history of temperature and stress in an installation environment. For example, a current sensor including a magnetic sensor device may be arranged near a current path such as a busbar through which a current flows. When a current flows through the current path, the temperature of the surrounding atmosphere also increases due to heat generation. When the magnetic sensor device is used for a long period of time in such an environment, the stress acting on the magnetic sensor chip included in the magnetic sensor device changes due to deterioration over time. Further, when an external force is input to the magnetic sensor chip from the outside, the stress acting on the magnetic sensor chip also changes.

In such a case, the stress-induced magnetic anisotropy is developed in the magnetoresistive portion (more specifically, the free layer) provided in the magnetic sensor chip 20 due to the variation in the stress. In a case where the stress-induced magnetic anisotropy is input in the magnetosensitive direction of the magnetic sensor chip, the offset voltage varies in the relationship between the output voltage and the input magnetic field.

Here, in the magnetic sensor chip 10 according to Preferred Embodiment 1, as described above, the direction of the initial stress acting on the substrate 11 and the direction in which the stress varies due to the usage in a state of being exposed to the environmental temperature are predominantly the direction parallel or substantially parallel to the first direction (more specifically, the longitudinal direction).

In addition, the direction of magnetic anisotropy of the free layer 36 in a state in which no external magnetic field acts on the magnetic sensor chip 10 is parallel or substantially parallel to the stacking direction and perpendicular or substantially perpendicular to the magnetosensitive direction.

Further, in a case where the compressive stress is applied to the substrate 11 so as to be predominantly in the first direction parallel or substantially parallel to the first main surface 11a, the direction of the stress-induced magnetic anisotropy that develops in the free layer 36 becomes perpendicular or substantially perpendicular to the magnetosensitive direction and the stacking direction by making the magnetostriction constant of the free layer 36 positive.

Therefore, even when the compressive stress acting in the first direction of the substrate 11 varies as described above, it is possible to prevent the stress-induced magnetic anisotropy that develops in the free layer from being input in the magnetosensitive direction. As a result, in the magnetic sensor chip 10 and the magnetic sensor device 100 according to Preferred Embodiment 1, it is possible to reduce or prevent the variation of the offset voltage, and thus the reliability with respect to the stress variation can be improved.

Manufacturing Method

In manufacturing the magnetic sensor device 100, first, the magnetic sensor chip 10 is manufactured. In manufacturing the magnetic sensor chip 10, a plate-shaped base material is prepared. As the base material, for example, a Si wafer can be used. Subsequently, dry etching is performed on the surface of the base material to form a trench portion, and a wiring portion is formed in the trench portion by, for example, a plating method or a sputtering method. As the wiring portion, for example, Cu or the like can be used. Next, a surplus wiring portion protruding outward from the opening of the trench portion is polished by, for example, a chemical mechanical polishing (CMP) method.

Subsequently, an oxide film is formed on the surface of the base material. As the oxide film, for example, a film of $SiO_2$ is formed. Next, the oxide film other than the region where the TMR element is to be formed is removed by, for example, photolithography and dry etching.

Subsequently, a TMR stacked film is formed on the entire or substantially the entire surface of the base material on which the oxide film has been patterned. The TMR stacked film is a film that becomes the TMR element (unit element) by being patterned. Specifically, a seed film, an antiferromagnetic layer film, a ferromagnetic film, a coupling film, a reference film, an intermediate film, a free film, and a cap film are sequentially formed on the entire or substantially the entire surface of the base material to form the TMR stacked film.

The seed film, the antiferromagnetic layer film, the ferromagnetic film, the coupling film, the reference film, the intermediate film, the free film, and the cap film have the same compositions as those of the seed layer 30, the antiferromagnetic layer 31, the ferromagnetic layer 32, the coupling layer 33, the reference layer 34, the intermediate layer 35, the free layer 36, and the cap layer 39 described above. Subsequently, the base material on which the TMR stacked film is formed is annealed in a magnetic field.

Next, the TMR stacked film is patterned using, for example, photolithography and dry etching to form a plurality of TMR elements (unit elements) in a desired region. At this time, the TMR stacked film is partially removed so that the seed film remains. In addition, the disk diameter of the TMR element is, for example, about 1 μm.

Subsequently, a portion of the remaining seed film is removed using, for example, photolithography and dry etching to form a wiring pattern. The wiring pattern is used to connect a plurality of TMR elements (unit elements) in series and parallel together with a metal wiring described later.

Next, an insulating film is formed on the surface of the base material so as to cover the plurality of TMR elements. As the insulating film, for example, $SiO_2$ can be used. Subsequently, a portion of the insulating film is removed using, for example, photolithography and dry etching to form a contact hole.

Next, a metal wiring is formed in the contact hole by, for example, photolithography and lift-off. As the metal wiring, for example, Cu can be used. The metal wiring is used to connect a plurality of TMR elements in series together with the wiring pattern.

To be specific, the lower sides of the plurality of TMR elements are connected to each other by the wiring pattern, and the upper sides thereof are connected to each other by the metal wiring in each of the first magnetoresistive element portion R1, the second magnetoresistive element portion R2, the third magnetoresistive element portion R3, and the fourth magnetoresistive element portion R4. The lower sides and the upper sides are alternately electrically connected to each other, whereby the plurality of TMR elements is connected in series and parallel.

Subsequently, a passivation film is formed on the insulating film so as to cover the metal wiring. As the passivation film, for example, $SiO_2$ can be used. Next, a portion of the passivation film is removed using, for example, photolithography and dry etching to form an opening.

Next, the magnetization direction of the reference layer is fixed. Here, as illustrated in FIG. 5 described above, the magnetization direction of the reference layer is determined for each of the first magnetoresistive element portion R1, the second magnetoresistive element portion R2, the third magnetoresistive element portion R3, and the fourth magnetoresistive element portion R4 constituting the full-bridge circuit.

As a method of fixing the magnetization direction of the reference layer 34 for each of the first magnetoresistive element portion R1, the second magnetoresistive element portion R2, the third magnetoresistive element portion R3, and the fourth magnetoresistive element portion R4, there are, for example, a method of locally heating by laser irradiation while applying a magnetic field by electromagnets or permanent magnets, a method of electrically heating a heater wiring arranged in the vicinity of the element while applying a magnetic field by electromagnets or permanent magnets, a method of performing heat treatment in a state in which a jig capable of locally applying a magnetic field is arranged, and the like.

Subsequently, the base material is subjected to backgrinding to thin the base material. Specifically, the surface of the base material on the side where the magnetoresistive element portion is not formed is ground. Next, the magnetic sensor chip is cut out by, for example, dicing the base material. Specifically, the magnetic sensor chip 10 is divided into individual pieces so that the longitudinal direction of the substrate 11 is parallel to the magnetization direction of the reference layer 34.

Subsequently, the magnetic sensor chip 10 is packaged by a known method. To be specific, the magnetic sensor chip 10 is fixed to the support frame 2c. In addition, the first lead frame 2a and the electrode formed on the magnetic sensor chip are connected by the bonding wire 3a, and the second lead frame 2b and the electrode formed on the magnetic sensor chip are connected by the bonding wire 3b. In this state, the magnetic sensor chip 10 is resin-molded on the mounting substrate 1.

Through the steps described above, the magnetic sensor device 100 according to Preferred Embodiment 1 can be manufactured.

Preferred Embodiment 2

FIG. 9 is a schematic cross-sectional view illustrating a stacked structure of a magnetoresistive element portion included in a magnetic sensor chip according to Preferred Embodiment 2 of the present invention. The magnetic sensor chip according to Preferred Embodiment 2 will be described with reference to FIG. 9.

As illustrated in FIG. 9, the magnetic sensor chip according to Preferred Embodiment 2 differs from the magnetic sensor chip 10 according to Preferred Embodiment 1 in the stacking structure of the unit elements defining the magnetoresistive element portion. Other configurations are the same or substantially the same.

To be more specific, in the unit element according to Preferred Embodiment 2, a free layer 36B is defined by a perpendicular magnetization film. More specifically, the unit element includes the seed layer 30, the antiferromagnetic layer 31, the ferromagnetic layer 32, the coupling layer 33, the reference layer 34, the intermediate layer 35, the free layer 36B, and the cap layer 39. These are stacked in order from the substrate 11 side.

For example, CoFeB can be used as the perpendicular magnetization film used for the free layer 36B. In this case, as compared with Preferred Embodiment 1, the free layer may be a single layer, and more specifically, for example, NiFe as the second ferromagnetic free layer may be omitted.

In the TMR structure, the perpendicular magnetization film can be provided by controlling the thickness of the free layer 36B on the intermediate layer 35 as the tunnel barrier layer to a certain value or less.

Figure 10:
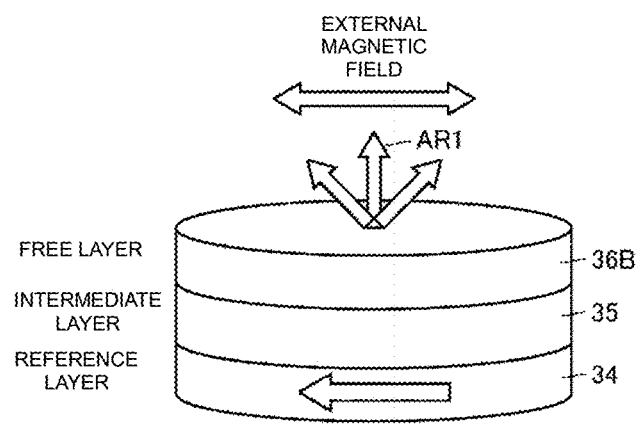
FIG. 10 is a perspective view schematically illustrating a stacked structure of a reference layer, an intermediate layer, and a free layer, and magnetization directions of the free layer and the reference layer in the magnetoresistive element portion illustrated in FIG. 9.

FIG. 10 is a perspective view schematically illustrating a stacked structure of a reference layer, an intermediate layer, and a free layer and a change in the direction of magnetic anisotropy of the free layer in the magnetoresistive element portion illustrated in FIG. 9.

As illustrated in FIG. 10, in a case where a perpendicular magnetization film is used as the free layer 36B, the gradient of the magnetic anisotropy of the free layer 36B with respect to the film surface changes according to the magnitude of the external magnetic field.

In a state where no external magnetic field acts on the magnetic sensor chip 10, the direction of the magnetic anisotropy of the free layer 36B is parallel or substantially parallel to the stacking direction of the reference layer 34, the intermediate layer 35, and the free layer 36B. In a case where the external magnetic field acts on the magnetic sensor chip 10, the magnetic anisotropy of the free layer 36B is inclined so as to approach the magnetosensitive direction as indicated by an arrow AR2.

Figure 11:
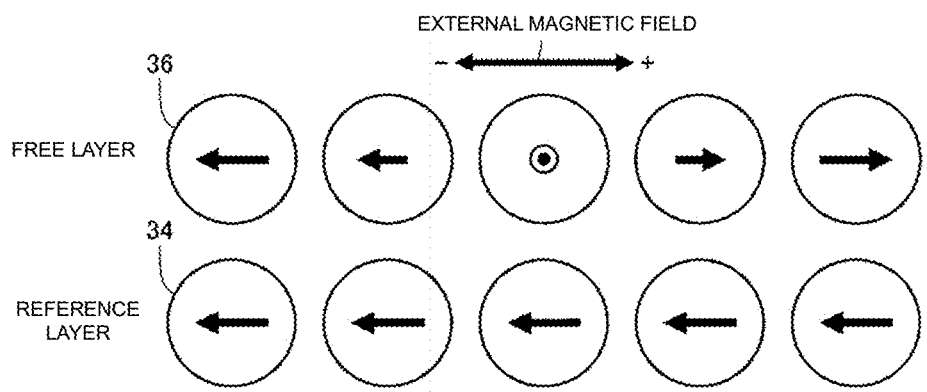
FIG. 11 is a plan view illustrating a state in which magnetization of the free layer is changed by an external magnetic field in the magnetoresistive element portion illustrated in FIG. 9.

FIG. 11 is a plan view illustrating a state in which the magnetization of the free layer is changed by the external magnetic field in the magnetoresistive element portion illustrated in FIG. 9.

Also in FIG. 11, one side of the magnetosensitive direction is defined as a positive direction (0° direction), and the other side of the magnetosensitive direction is defined as a negative direction (180° direction). As an example, as described above, the magnetization of the reference layer 34 is parallel or substantially parallel to the magnetosensitive direction and is fixed so as to face the other side of the magnetosensitive direction.

In this case, the left side in FIG. 11 illustrates a case where the external magnetic field is large in the 180° direction (negative direction), the center in FIG. 11 illustrates a case where the external magnetic field does not act (is not applied), and the right side in FIG. 11 illustrates a case where the external magnetic field is large in the 0° direction (positive direction).

As illustrated in the center of FIG. 11, in a case where no external magnetic field acts, the magnetic anisotropy is perpendicular or substantially perpendicular to the film surface of the free layer 36B in the free layer 36B.

As illustrated in the second row from the left in FIG. 11, when the external magnetic field acts in the negative direction, the magnetic anisotropy in the free layer 36B is inclined so as to approach the other side of the magnetosensitive direction. Further, when the external magnetic field in the negative direction is increased, the magnetic anisotropy is inclined so as to further approach the other side of the magnetosensitive direction as illustrated in the first row from the left in FIG. 11.

As illustrated in the fourth row from the left in FIG. 11, when the external magnetic field is applied in the positive direction, the magnetic anisotropy in the free layer 36B is inclined so as to approach one side in the magnetosensitive direction. Furthermore, when the external magnetic field in the positive direction is increased, the magnetic anisotropy is inclined so as to further approach one side of the magnetosensitive direction.

As described above, the direction of the magnetic anisotropy of the free layer 36B changes depending on the intensity of the external magnetic field, such that the magnetic sensor chip 10 can detect the external magnetic field.

Even in the case of the above-described configuration, when the stress acts on the substrate 11, the first direction in which the stress predominantly acts, the relationship between the direction of the magnetic anisotropy of the free layer 36B and the stacking direction and the magnetosensitive direction when no external magnetic field acts, and the relationship between the direction of the stress-induced magnetic anisotropy that develops in the free layer 36B and the stacking direction and the magnetosensitive direction are the same or substantially the same as those in Preferred Embodiment 1.

Therefore, also in the magnetic sensor chip and the magnetic sensor device according to Preferred Embodiment 2, the same or substantially the same advantageous effects as those in Preferred Embodiment 1 can be obtained.

Preferred Embodiment 3

Figure 12:
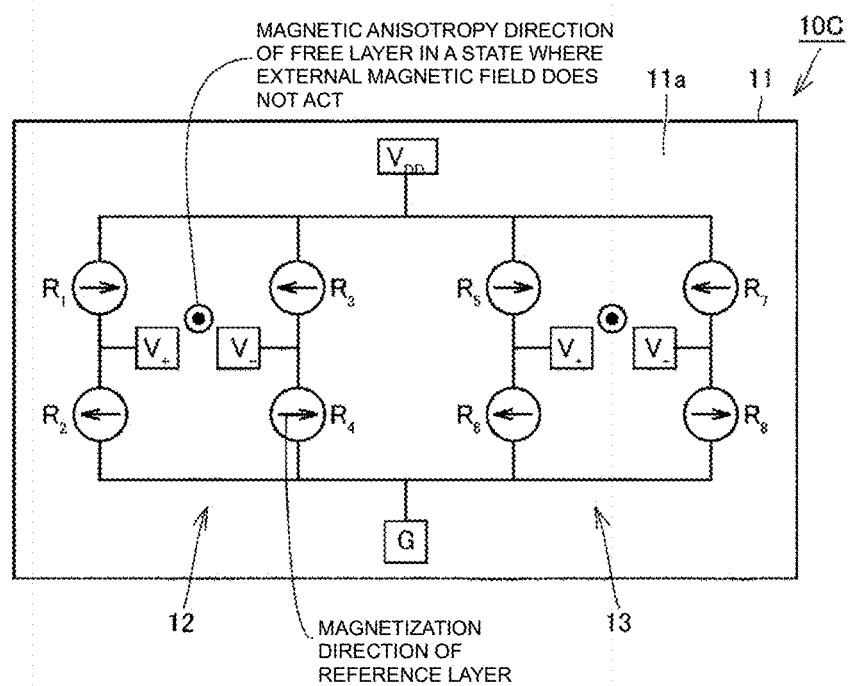
FIG. 12 is a schematic plan view illustrating a magnetic sensor chip according to Preferred Embodiment 3 of the present invention.

FIG. 12 is a schematic plan view illustrating a magnetic sensor chip according to Preferred Embodiment 3 of the present invention. A magnetic sensor chip 10C according to Preferred Embodiment 3 will be described with reference to FIG. 12.

As illustrated in FIG. 12, the magnetic sensor chip 10C according to Preferred Embodiment 3 differs from the magnetic sensor chip 10 according to Preferred Embodiment 1 in the configuration of a magnetoresistive element portion 20C. Other configurations are the same or substantially the same.

In the magnetoresistive element portion 20C, a first full-bridge circuit 12 and a second full-bridge circuit 13 are connected in parallel.

The magnetoresistive element portion 20C includes the first magnetoresistive element portion R1, the second magnetoresistive element portion R2, the third magnetoresistive element portion R3, the fourth magnetoresistive element portion R4, a fifth magnetoresistive element portion R5, a sixth magnetoresistive element portion R6, a seventh magnetoresistive element portion R7, and an eighth magnetoresistive element portion R8.

The first full-bridge circuit 12 includes the first magnetoresistive element portion R1, the second magnetoresistive element portion R2, the third magnetoresistive element portion R3, and the fourth magnetoresistive element portion R4. The second full-bridge circuit 13 is configured by the fifth magnetoresistive element portion R5, the sixth magnetoresistive element portion R6, the seventh magnetoresistive element portion R7, and the eighth magnetoresistive element portion R8.

The first full-bridge circuit 12 and the second full-bridge circuit 13 are connected in parallel. The second full-bridge circuit 13 has an output characteristic that is opposite in positive and negative sign to the output characteristic of the first full-bridge circuit 12.

Even in the case of the above-described configuration, when the stress acts on the substrate 11, the first direction in which the stress predominantly acts, the relationship between the direction of the magnetic anisotropy of the free layer 36 and the stacking direction and the magnetosensitive direction when no external magnetic field acts, and the relationship between the direction of the stress-induced magnetic anisotropy that develops in the free layer 36 and the stacking direction and the magnetosensitive direction are the same or substantially the same as those in Preferred Embodiment 1.

Therefore, also in the magnetic sensor chip 10C according to Preferred Embodiment 3 and the magnetic sensor device including the same or substantially the same advantageous effects as those in Preferred Embodiment 1 can be obtained.

Preferred Embodiment 4

Figure 13:
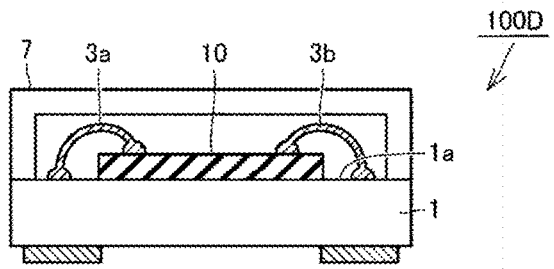
FIG. 13 is a diagram illustrating a magnetic sensor device including a magnetic sensor chip according to Preferred Embodiment 4 of the present invention.
Figure 14:
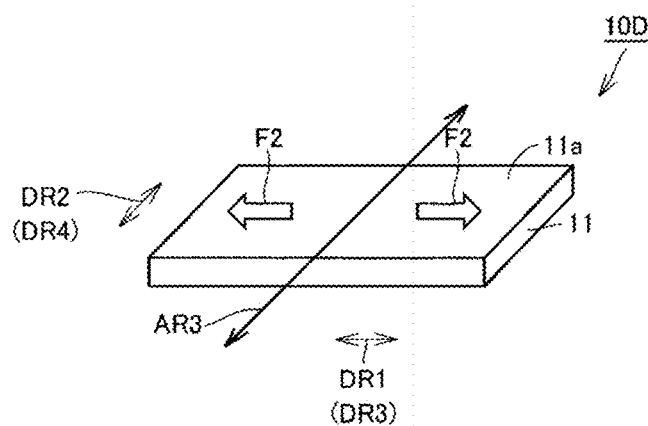
FIG. 14 is a diagram illustrating a stress acting on the magnetic sensor chip according to Preferred Embodiment 4 of the present invention and stress-induced magnetic anisotropy developed by the stress.

FIG. 13 is a diagram illustrating a magnetic sensor device including a magnetic sensor chip according to Preferred Embodiment 4 of the present invention. FIG. 14 is a diagram illustrating the stress acting on the magnetic sensor chip according to Preferred Embodiment 4 and the stress-induced magnetic anisotropy developed by the stress.

A magnetic sensor device 100D according to Preferred Embodiment 4 differs from the magnetic sensor device 100 according to Preferred Embodiment 1 in a method of mounting a magnetic sensor chip 10D on the mounting substrate 1. Thus, Preferred Embodiment differs mainly in that a tensile stress acts along the longitudinal direction of the substrate 11 as an initial stress acting on the magnetic sensor chip 10D, and that the free layer 36 has a negative magnetostriction constant.

As illustrated in FIG. 13, the magnetic sensor device 100D includes the mounting substrate 1, the bonding wires 3a and 3b, a covering member 7, and the magnetic sensor chip 10D.

The magnetic sensor chip 10D is fixed on the mounting surface 1a of the mounting substrate 1. To be specific, the magnetic sensor chip 10D is fixed to the mounting surface 1a such that the first main surface 11a of the substrate 11 on which the magnetoresistive element portion is provided faces the side opposite to the side where the mounting substrate 1 is positioned. The magnetic sensor chip 10D is fixed to the mounting surface 1a by an adhesive or the like, for example.

One end side of the magnetic sensor chip 10D is electrically connected by the bonding wire 3a to a terminal electrode provided on the mounting surface 1a. The other end side of the magnetic sensor chip 10 is electrically connected by the bonding wire 3b to another terminal electrode provided on the mounting surface 1a.

The covering member 7 covers the mounting surface 1a so that a gap is provided between the covering member 7 and the magnetic sensor chip 10D. The magnetic sensor chip 10D is hollow-molded. That is, a structure having a thermal expansion coefficient larger than that of the substrate 11 is not arranged around the first main surface 11a of the substrate 11. Meanwhile, the thermal expansion coefficient of the mounting substrate 1 is larger than that of the substrate 11. The thermal expansion coefficient of the adhesive provided between the mounting substrate 1 and the substrate 11 may also be larger than the thermal expansion coefficient of the substrate 11.

As illustrated in FIG. 14, the magnetic sensor chip 10D has a longitudinal shape extending in the longitudinal direction, and has a magnetosensitive direction (DR3 direction) parallel or substantially parallel to the longitudinal direction (DR1 direction).

In this case, in the magnetic sensor chip 10, the stress acts on the substrate 11 so as to be predominantly in the first direction parallel or substantially parallel to the first main surface 11a of the substrate 11. Specifically, the first direction is parallel or substantially parallel to the longitudinal direction and also parallel or substantially parallel to the magnetosensitive direction. As a stress acting in the first direction, a tensile stress F2 acts on the substrate 11.

The magnetic sensor chip 10D is molded such that the initial stress acts in a direction parallel or substantially parallel to the first direction (more specifically, the longitudinal direction) due to a difference between the thermal expansion coefficient of the substrate 11 and a thermal expansion coefficient of a gap (hollow) around the magnetic sensor chip 10D (more specifically, on the first main surface 11a side of the substrate 11). The magnetic sensor chip 10 is molded in this manner, such that the direction of the initial stress and the direction in which the stress varies due to the usage in a state of being exposed to the environmental temperature are predominantly the direction parallel or substantially parallel to the first direction (more specifically, the longitudinal direction).

The thermal expansion coefficient of the gap around the magnetic sensor chip 10D is smaller than that of the substrate 11. Thus, the tensile stress F2 as described above can be applied.

As described above, the free layer of the magnetoresistive element portion has a negative magnetostriction constant. Thus, in a state in which the tensile stress acts on the substrate 11 in a first direction parallel or substantially parallel to the longitudinal direction, the stress-induced magnetic anisotropy develops in the free layer in a direction perpendicular or substantially perpendicular to the magnetosensitive direction. By setting the composition of the free layer 36 (more specifically, the composition of the first ferromagnetic free layer) to Ni83.1Fe16.9, the magnetostriction constant of the free layer can be set to a negative value of −1 ppm.

Also in the structure of mounting the magnetic sensor chip 10 on the mounting substrate 1 as in the following Modification 3, as in Preferred Embodiment 4 described above, the direction of the initial stress and the direction in which the stress varies due to the usage in a state of being exposed to the environmental temperature are predominantly the direction parallel or substantially parallel to the first direction (more specifically, the longitudinal direction). Further, the tensile stress F2 described above can be applied to the substrate 11.

Figure 15:
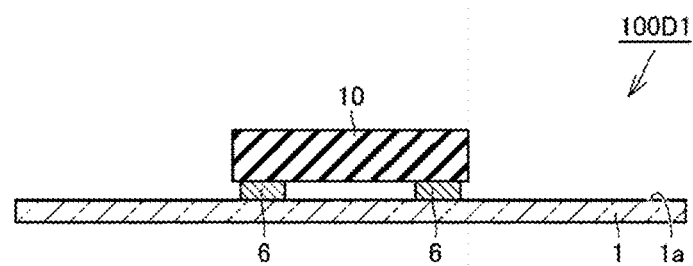
FIG. 15 is a diagram illustrating a magnetic sensor device according to Modification 3 of a preferred embodiment of the present invention.

FIG. 15 is a diagram illustrating a magnetic sensor device according to Modification 3 of a preferred embodiment of the present invention. As illustrated in FIG. 15, a magnetic sensor device 100D1 according to Modification 3 includes the mounting substrate 1, the conductive member 6, and the magnetic sensor chip 10.

The magnetic sensor chip 10 is electrically connected to a terminal electrode provided on the mounting substrate 1 by the conductive member 6. The conductive member 6 is made of, for example, a member having conductivity such as a conductive paste. The magnetic sensor chip 10 is arranged such that the first main surface 11a of the substrate 11 on which the magnetoresistive element portion is provided faces the mounting substrate 1.

In a portion where the conductive member 6 is not provided, a gap is provided between the magnetic sensor chip 10 and the mounting substrate 1. That is, a structure having a thermal expansion coefficient larger than that of the substrate 11 is not arranged around the first main surface 11a of the substrate 11. Even when the magnetic sensor chip 10 is mounted on the mounting substrate 1 in this manner, the tensile stress F2 as described above can be applied to the substrate 11.

Also in the magnetic sensor chip 10 according to Preferred Embodiment 3, as described above, the direction of the initial stress acting on the substrate 11 and the direction in which the stress varies due to the usage in a state of being exposed to the environmental temperature are predominantly the direction parallel or substantially parallel to the first direction (more specifically, the longitudinal direction).

In addition, the direction of magnetic anisotropy of the free layer 36 in a state in which no external magnetic field acts on the magnetic sensor chip 10 is parallel or substantially parallel to the stacking direction and perpendicular or substantially perpendicular to the magnetosensitive direction.

Further, in a case where the tensile stress is applied to the substrate 11 so as to be predominantly in the first direction parallel or substantially parallel to the first main surface 11a, the direction of the stress-induced magnetic anisotropy that develops in the free layer becomes perpendicular or substantially perpendicular to the magnetosensitive direction and the stacking direction as indicated by an arrow AR3 in FIG. 14 by making the magnetostriction constant of the free layer negative.

Therefore, even when the tensile stress acting in the first direction of the substrate 11 varies as described above, it is possible to prevent the stress-induced magnetic anisotropy that develops in the free layer from being input in the magnetosensitive direction. As a result, in the magnetic sensor chip 10 and the magnetic sensor device 100D according to Preferred Embodiment 3, it is possible to reduce or prevent the variation of the offset voltage, and thus the reliability with respect to the stress variation can be improved.

Preferred Embodiment 5

Figure 16:
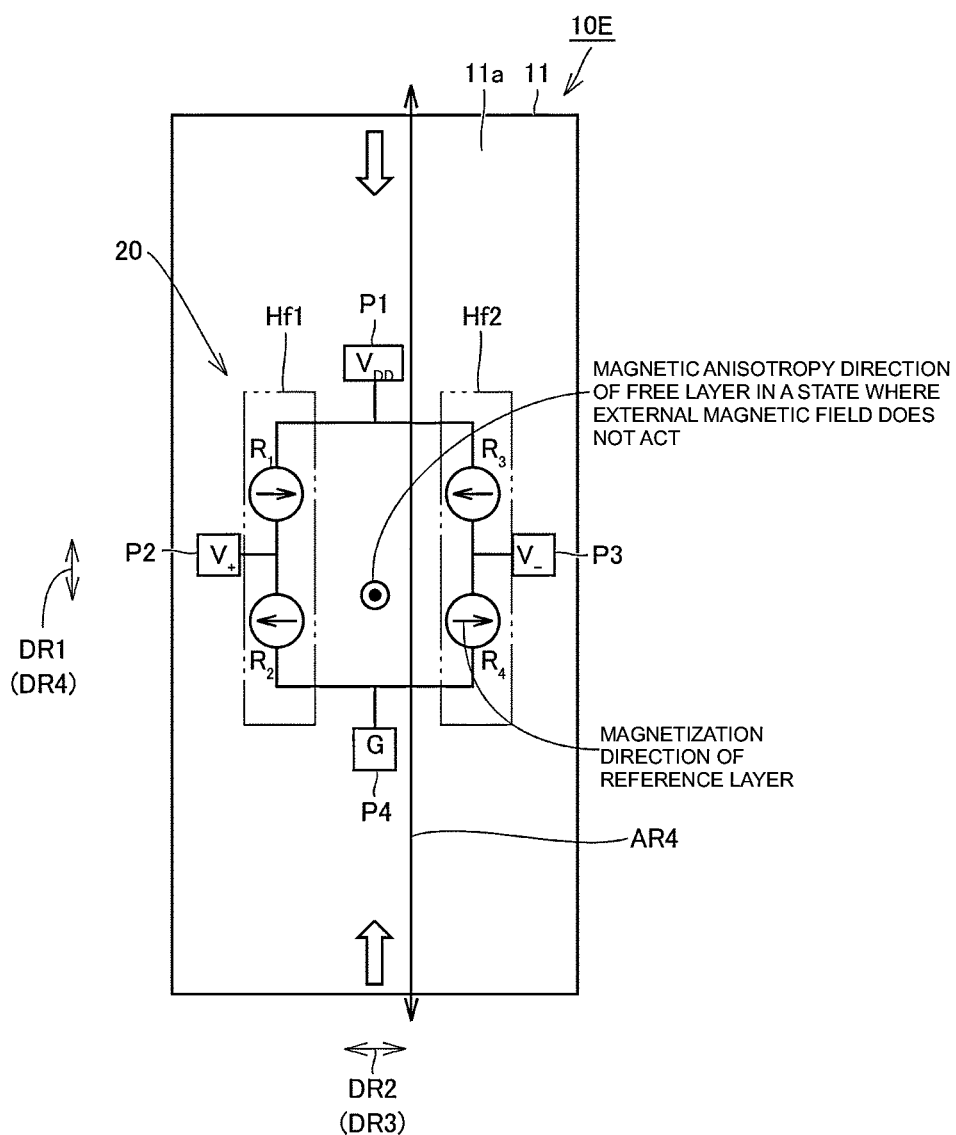
FIG. 16 is a schematic plan view illustrating a magnetic sensor chip according to Preferred Embodiment 5 of the present invention.

FIG. 16 is a schematic plan view illustrating a magnetic sensor chip according to Preferred Embodiment 5 of the present invention. A magnetic sensor chip 10E according to Preferred Embodiment 5 will be described with reference to FIG. 16.

As illustrated in FIG. 16, the magnetic sensor chip 10E according to Preferred Embodiment 5 is similar to the magnetic sensor chip 10 according to Preferred Embodiment 1 in that the compressive stress acts in the longitudinal direction (DR1 direction) of the substrate 11. Also in this case, when a stress acts on the substrate 11, the first direction in which the stress predominantly acts is parallel or substantially parallel to the longitudinal direction of the substrate 11.

Meanwhile, a different point from Preferred Embodiment 1 is that the magnetization of the reference layer 34 is fixed in a direction parallel or substantially parallel to the lateral direction (DR2 direction) of the substrate 11 and the magnetosensitive direction (DR3 direction) is parallel or substantially parallel to the lateral direction. The configuration of the magnetoresistive element portion is the same or substantially the same as that of Preferred Embodiment 1.

Also in the magnetic sensor chip 10E according to Preferred Embodiment 5, the direction of the initial stress acting on the substrate 11 and the direction in which the stress varies due to the usage in a state of being exposed to the environmental temperature are predominantly the direction parallel or substantially parallel to the first direction (more specifically, the longitudinal direction).

In addition, the direction of magnetic anisotropy of the free layer 36 in a state in which no external magnetic field acts on the magnetic sensor chip 10 is parallel or substantially parallel to the stacking direction and perpendicular or substantially perpendicular to the magnetosensitive direction.

Further, in a case where the compressive stress is applied to the substrate 11 so as to be predominantly in the first direction parallel or substantially parallel to the first main surface 11a, the direction of the stress-induced magnetic anisotropy that develops in the free layer 36 becomes perpendicular or substantially perpendicular to the magnetosensitive direction and the stacking direction as indicated by an arrow AR4 by making the magnetostriction constant of the free layer 36 negative.

Therefore, even when the compressive stress acting in the first direction of the substrate 11 varies, it is possible to prevent the stress-induced magnetic anisotropy that develops in the free layer from being input in the magnetosensitive direction. As a result, in the magnetic sensor chip 10E according to Preferred Embodiment 5 and the magnetic sensor device including the same, it is possible to reduce or prevent the variation of the offset voltage, and thus the reliability with respect to the stress variation can be improved.

Preferred Embodiment 6

Figure 17:
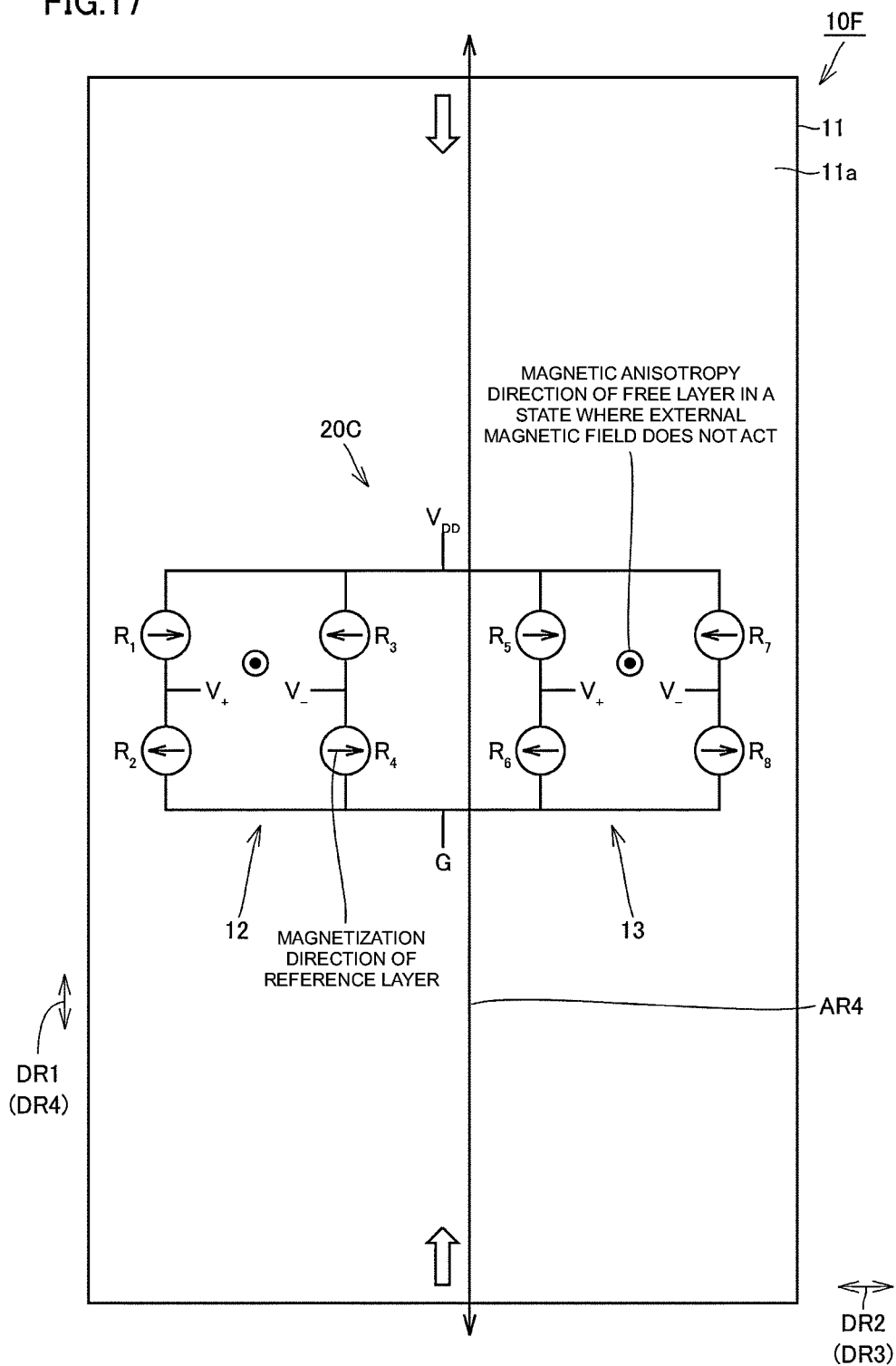
FIG. 17 is a schematic plan view illustrating a magnetic sensor chip according to Preferred Embodiment 6 of the present invention.

FIG. 17 is a schematic plan view illustrating a magnetic sensor chip according to Preferred Embodiment 6 of the present invention. A magnetic sensor chip 10F according to Preferred Embodiment 6 will be described with reference to FIG. 17.

As illustrated in FIG. 17, the magnetic sensor chip 10F according to Preferred Embodiment 6 differs from the magnetic sensor chip 10E according to Preferred Embodiment 5 in the configuration of the magnetoresistive element portion 20C. Other configurations are the same or substantially the same.

In the magnetoresistive element portion 20C, the first full-bridge circuit 12 and the second full-bridge circuit 13 are connected in parallel.

The magnetoresistive element portion 20C includes the first magnetoresistive element portion R1, the second magnetoresistive element portion R2, the third magnetoresistive element portion R3, the fourth magnetoresistive element portion R4, the fifth magnetoresistive element portion R5, the sixth magnetoresistive element portion R6, the seventh magnetoresistive element portion R7, and the eighth magnetoresistive element portion R8.

The first full-bridge circuit 12 is configured by the first magnetoresistive element portion R1, the second magnetoresistive element portion R2, the third magnetoresistive element portion R3, and the fourth magnetoresistive element portion R4. The second full-bridge circuit 13 is configured by the fifth magnetoresistive element portion R5, the sixth magnetoresistive element portion R6, the seventh magnetoresistive element portion R7, and the eighth magnetoresistive element portion R8.

The first full-bridge circuit 12 and the second full-bridge circuit 13 are connected in parallel. The second full-bridge circuit 13 has an output characteristic that is opposite in positive and negative sign to the output characteristic of the first full-bridge circuit 12.

Even when configured as described above, the magnetic sensor chip 10F and the magnetic sensor device including the same according to Preferred Embodiment 6 can obtain the same or substantially the same advantageous effects as those of Preferred Embodiment 5.

Preferred Embodiment 7

Figure 18:
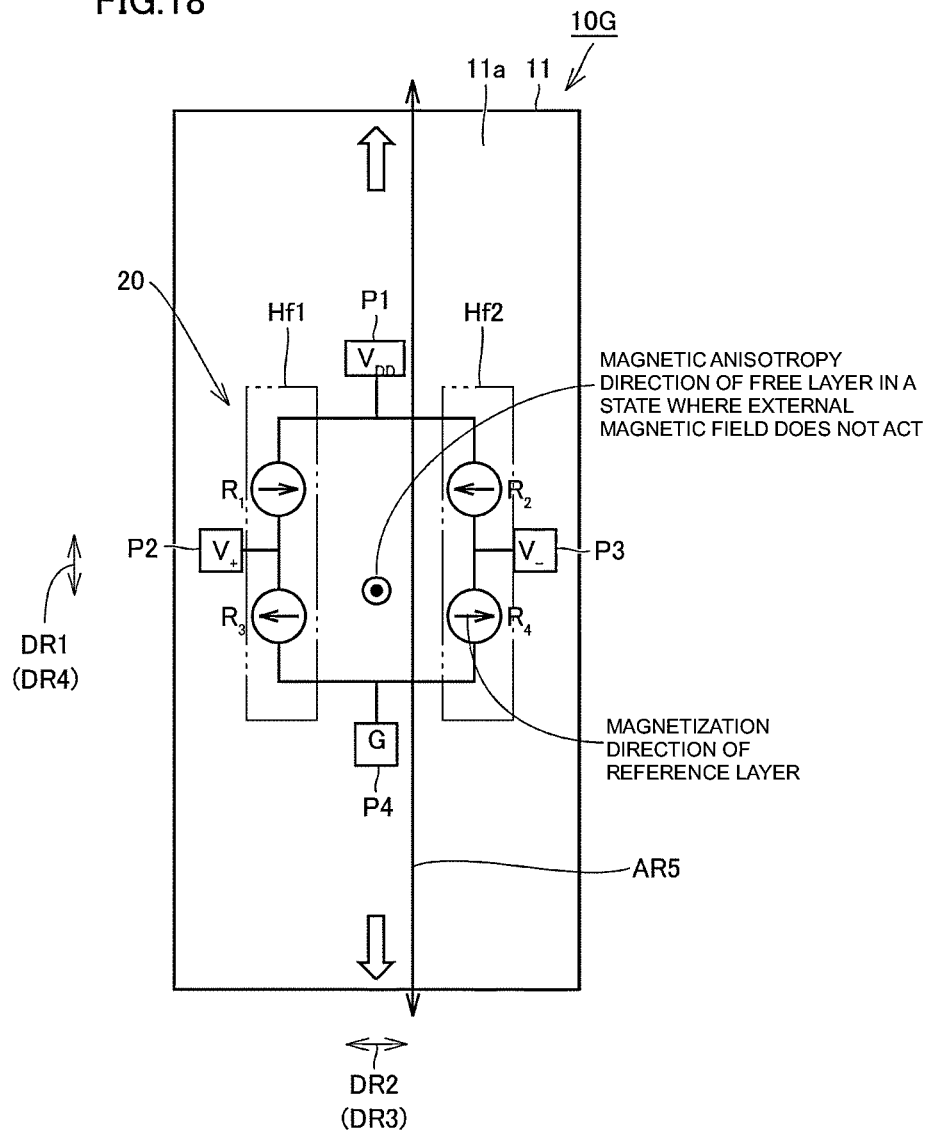
FIG. 18 is a schematic plan view illustrating a magnetic sensor chip according to Preferred Embodiment 7 of the present invention.

FIG. 18 is a schematic plan view illustrating a magnetic sensor chip according to Preferred Embodiment 7 of the present invention. A magnetic sensor chip 10G according to Preferred Embodiment 7 will be described with reference to FIG. 18.

As illustrated in FIG. 18, the magnetic sensor chip 10E according to Preferred Embodiment 7 is the same as or similar to the magnetic sensor chip 10D according to Preferred Embodiment 4 in that the tensile stress acts in the longitudinal direction (DR1 direction) of the substrate 11. Also in this case, when a stress acts on the substrate 11, the first direction in which the stress predominantly acts is parallel or substantially parallel to the longitudinal direction of the substrate 11.

Meanwhile, a different point from Preferred Embodiment 4 is that the magnetization of the reference layer 34 is fixed in a direction parallel or substantially parallel to the lateral direction (DR2 direction) of the substrate 11 and the magnetosensitive direction (DR3 direction) is parallel or substantially parallel to the lateral direction. The configuration of the magnetoresistive element portion is the same or substantially the same as that of Preferred Embodiment 5.

Also in the magnetic sensor chip 10G according to Preferred Embodiment 7, the direction of the initial stress acting on the substrate 11 and the direction in which the stress varies due to the usage in a state of being exposed to the environmental temperature are predominantly the direction parallel or substantially parallel to the first direction (more specifically, the longitudinal direction).

In addition, the direction of magnetic anisotropy of the free layer 36 in a state in which no external magnetic field acts on the magnetic sensor chip 10G is parallel or substantially parallel to the stacking direction and perpendicular or substantially perpendicular to the magnetosensitive direction.

Further, in a case where the tensile stress is applied to the substrate 11 so as to be predominantly in the first direction parallel or substantially parallel to the first main surface 11a, the direction of the stress-induced magnetic anisotropy that develops in the free layer 36 becomes perpendicular or substantially perpendicular to the magnetosensitive direction and the stacking direction as indicated by an arrow AR5 by making the magnetostriction constant of the free layer 36 positive.

Therefore, even when the tensile stress acting in the first direction of the substrate 11 varies, it is possible to prevent the stress-induced magnetic anisotropy that develops in the free layer from being input in the magnetosensitive direction. As a result, in the magnetic sensor chip 10G according to Preferred Embodiment 7 and the magnetic sensor device including the same, it is possible to reduce or prevent the variation in the offset voltage, and thus the reliability with respect to the stress variation can be improved.

Preferred Embodiment 8

Figure 19:
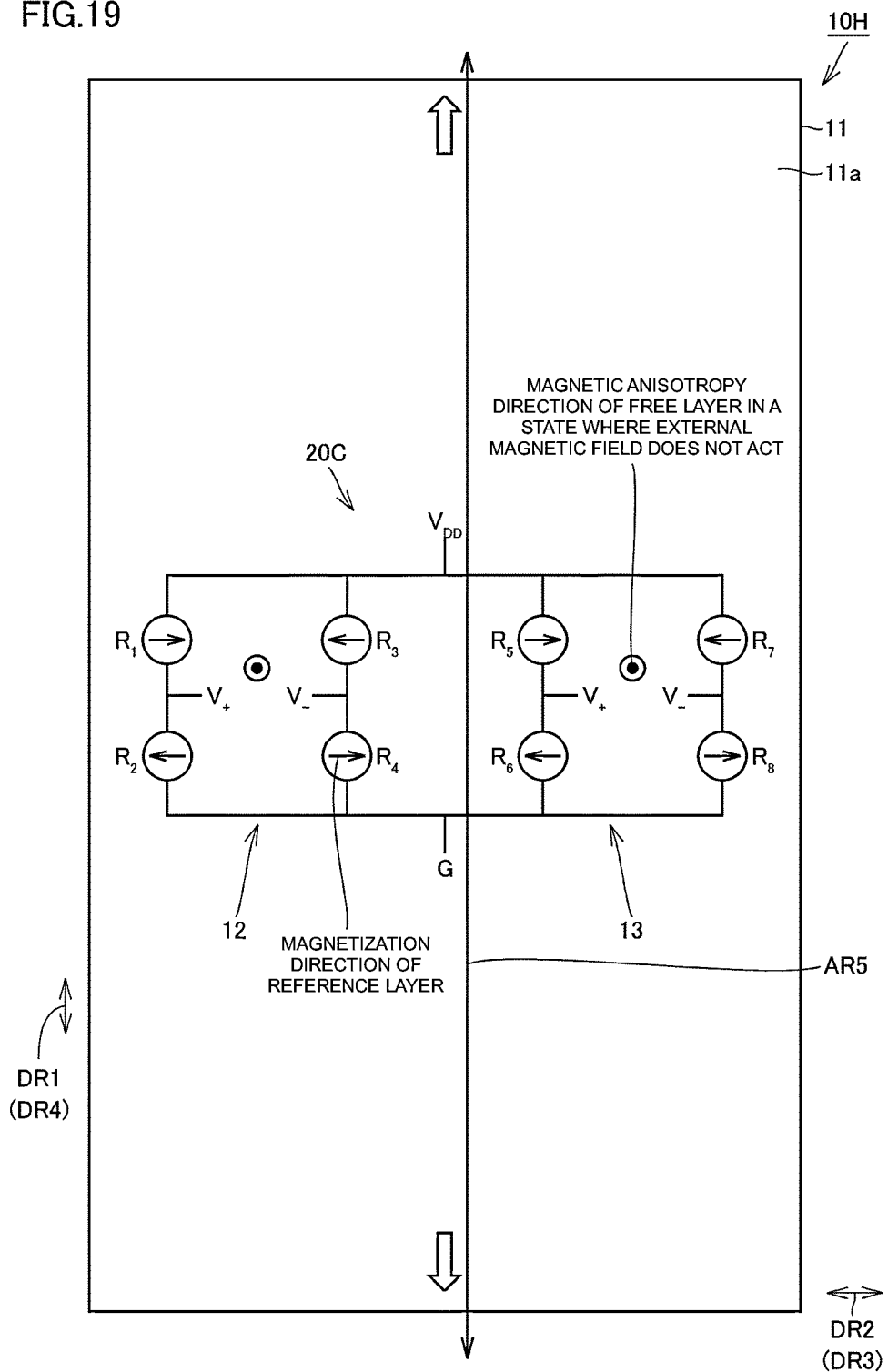
FIG. 19 is a schematic plan view illustrating a magnetic sensor chip according to Preferred Embodiment 8 of the present invention.

FIG. 19 is a schematic plan view illustrating a magnetic sensor chip according to Preferred Embodiment 8 of the present invention. A magnetic sensor chip 10H according to Preferred Embodiment 8 will be described with reference to FIG. 19.

As illustrated in FIG. 19, the magnetic sensor chip 10H according to Preferred Embodiment 8 differs from the magnetic sensor chip 10G according to Preferred Embodiment 7 in the configuration of the magnetoresistive element portion 20C. Other configurations are the same or substantially the same.

In the magnetoresistive element portion 20C, the first full-bridge circuit 12 and the second full-bridge circuit 13 are connected in parallel.

The magnetoresistive element portion 20C includes the first magnetoresistive element portion R1, the second magnetoresistive element portion R2, the third magnetoresistive element portion R3, the fourth magnetoresistive element portion R4, the fifth magnetoresistive element portion R5, the sixth magnetoresistive element portion R6, the seventh magnetoresistive element portion R7, and the eighth magnetoresistive element portion R8.

The first full-bridge circuit 12 is configured by the first magnetoresistive element portion R1, the second magnetoresistive element portion R2, the third magnetoresistive element portion R3, and the fourth magnetoresistive element portion R4. The second full-bridge circuit 13 is configured by the fifth magnetoresistive element portion R5, the sixth magnetoresistive element portion R6, the seventh magnetoresistive element portion R7, and the eighth magnetoresistive element portion R8.

The first full-bridge circuit 12 and the second full-bridge circuit 13 are connected in parallel. The second full-bridge circuit 13 has an output characteristic that is opposite in positive and negative sign to the output characteristic of the first full-bridge circuit 12.

Even when configured as described above, the magnetic sensor chip 10F and the magnetic sensor device including the same according to Preferred Embodiment 8 can obtain the same or substantially the same advantageous effects as those of Preferred Embodiment 7.

Qualitative Evaluation

Hereinafter, using magnetic sensor chips in which the relationship between the stress (tensile stress or compressive stress) acting on the substrate of the magnetic sensor chip and the magnetosensitive direction and the orientation of the longitudinal direction of the substrate were variously changed, changes in sensitivity and variations in offset voltage when the stress acting on the substrate changed over time were qualitatively evaluated.

FIG. 20 is a diagram qualitatively illustrating a first evaluation result in a case where the longitudinal direction of the substrate and the magnetosensitive direction in the magnetic sensor chip are parallel or substantially parallel to each other and the stress acting on the substrate decreases with time.

In performing the above first evaluation, magnetic sensor chips according to Comparative Examples 1 to 6 and Examples 1 to 6 of preferred embodiments of the present invention were prepared.

As the magnetic sensor chips according to Comparative Examples 1 to 3 and Examples 1 to 3, magnetic sensor chips were prepared in which the tensile stress acted as the initial stress in the first direction (the longitudinal direction of the substrate 11) in which the stress predominantly acted, and the magnetosensitive direction was parallel or substantially parallel to the longitudinal direction. In addition, the direction of magnetic anisotropy of the free layer in a state in which no external magnetic field acts on the magnetic sensor chip was set to be parallel or substantially parallel to the stacking direction and perpendicular to the magnetosensitive direction. Note that the magnetic sensor chips according to Examples 1 to 3 that had the same or substantially the same configuration as that of the magnetic sensor chip 10D according to Preferred Embodiment 4 were used.

In each of the magnetic sensor chips according to Comparative Examples 1 to 3, the magnetostriction constant of the free layer was set to be positive. Therefore, in Comparative Examples 1 to 3, when the tensile stress acting in the longitudinal direction changes, stress-induced magnetic anisotropy develops in a direction parallel or substantially parallel to the magnetosensitive direction. In Comparative Examples 1 to 3, the bias of the developed stress-induced magnetic anisotropy was changed.

Specifically, in Comparative Example 1, the stress-induced magnetic anisotropies oriented in the positive direction and the negative direction of the magnetosensitive direction are distributed at the same probability, and there is no bias in the stress-induced magnetic anisotropy. In Comparative Example 2, the ratio of the stress-induced magnetic anisotropy oriented in the positive direction of the magnetosensitive direction is large, and the stress-induced magnetic anisotropy is biased in the positive direction of the magnetosensitive direction. In Comparative Example 3, the ratio of the stress-induced magnetic anisotropy oriented in the negative direction of the magnetosensitive direction is large, and the stress-induced magnetic anisotropy is biased in the negative direction of the magnetosensitive direction.

In each of the magnetic sensor chips according to Examples 1 to 3, the magnetostriction constant of the free layer was set to be negative. Therefore, in Examples 1 to 3, when the tensile stress acting in the longitudinal direction changes, the stress-induced magnetic anisotropy develops in the direction perpendicular or substantially perpendicular to the magnetosensitive direction. In Examples 1 to 3, the bias of the developed stress magnetic anisotropy was changed.

Specifically, in Example 1, the stress-induced magnetic anisotropies oriented in the positive direction and the negative direction in the direction perpendicular or substantially perpendicular to the magnetosensitive direction are distributed at the same probability, and there is no bias in the stress-induced magnetic anisotropy. In Example 2, the ratio of the stress-induced magnetic anisotropy oriented in the positive direction in the direction perpendicular or substantially perpendicular to the magnetosensitive direction is large, and the stress-induced magnetic anisotropy is biased in the positive direction in the direction perpendicular or substantially perpendicular to the magnetosensitive direction. In Example 3, the ratio of the stress-induced magnetic anisotropy oriented in the negative direction in the direction perpendicular or substantially perpendicular to the magnetosensitive direction is large, and the stress-induced magnetic anisotropy is biased in the negative direction in the direction perpendicular or substantially perpendicular to the magnetosensitive direction.

In Comparative Examples 1 to 3 and Examples 1 to 3, the sensitivity and the offset voltage in the case where the tensile stress acting in the longitudinal direction of the substrate decreases with time will be described.

Regarding the sensitivity, in any of Comparative Examples 1 to 3, the sensitivity is large when a large tensile stress acts as in the initial state. Even when the tensile stress becomes small due to a change with time, since the tensile stress acts, the sensitivity becomes slightly large as compared with the case where the tensile stress does not act. Meanwhile, when the tensile stress decreases with time, the sensitivity decreases because the tensile stress becomes smaller than that in the initial state. Regarding such evaluation results, in FIG. 20, the items of sensitivity (large stress), sensitivity (small stress), and sensitivity variation (large stress→small stress) are written as ++, +, and −, respectively.

Regarding the offset voltage, in Comparative Example 1, since there is no bias in the stress-induced magnetic anisotropy that develops, the stress-induced magnetic anisotropy is not input in the magnetosensitive direction. For this reason, no offset voltage is generated in both the initial state and the state changed over time, and the offset voltage does not vary even when the stress varies. Regarding such evaluation results, in FIG. 20, the items of offset (large stress), offset (small stress), and offset variation (large stress→small stress) are written as No, No, and No, respectively.

Meanwhile, in Comparative Example 2, the stress-induced magnetic anisotropy is biased in the positive direction of the magnetosensitive direction as described above. Therefore, when a large tensile stress acts as in the initial state, a large positive offset voltage is generated. When the tensile stress decreases with time, a small positive offset voltage is generated. Therefore, when the tensile stress decreases with time, the offset voltage decreases. Regarding such evaluation results, in FIG. 20, the items of offset (large stress), offset (small stress), and offset variation (large stress→small stress) are written as ++, +, and −, respectively.

In Comparative Example 3, as described above, the stress-induced magnetic anisotropy is biased in the negative direction of the magnetosensitive direction. Therefore, when a large tensile stress acts as in the initial state, a large negative offset voltage is generated. When the tensile stress decreases with time, a small negative offset voltage is generated. Therefore, when the tensile stress decreases with time, the offset voltage increases. Regarding such evaluation results, in FIG. 20, the items of offset (large stress), offset (small stress), and offset variation (large stress→small stress) are written as −−, −, and +, respectively.

Regarding the sensitivity, in any of Examples 1 to 3, when a large tensile stress acts as in the initial state, the sensitivity decreases. Even in the case where the tensile stress becomes small due to a change with time, since the tensile stress acts, the sensitivity becomes slightly small as compared with the case where the tensile stress does not act. Meanwhile, when the tensile stress decreases with time, the sensitivity increases because the tensile stress becomes smaller than that in the initial state. Regarding such evaluation results, in FIG. 20, the items of sensitivity (large stress), sensitivity (small stress), and sensitivity variation (large stress→small stress) are written as −−, −, and +, respectively.

Regarding the offset voltage, in any of Examples 1 to 3, the stress-induced magnetic anisotropy is oriented in the direction perpendicular or substantially perpendicular to the magnetosensitive direction as described above. As such, the offset voltage is not generated regardless of the magnitude of the tensile stress and the presence or absence of the bias of the stress-induced magnetic anisotropy. Therefore, even when the tensile stress varies due to a change with time, the offset voltage does not vary. Regarding such evaluation results, in FIG. 20, the items of offset (large stress), offset (small stress), and offset variation (large stress→small stress) are written as No, No, and No, respectively.

As the magnetic sensor chips according to Comparative Examples 4 to 6 and Examples 4 to 6, magnetic sensor chips were prepared in which the compressive stress acted as the initial stress in the first direction (the longitudinal direction of the substrate 11) in which the stress predominantly acted, and the magnetosensitive direction was parallel or substantially parallel to the longitudinal direction. In addition, the direction of magnetic anisotropy of the free layer in a state in which no external magnetic field acts on the magnetic sensor chip was set to be parallel or substantially parallel to the stacking direction and perpendicular or substantially perpendicular to the magnetosensitive direction. The magnetic sensor chips according to Examples 4 to 6 that had the same or substantially the same configuration as that of the magnetic sensor chip 10 according to Preferred Embodiment 1 were used.

In each of the magnetic sensor chips according to Comparative Examples 4 to 6, the magnetostriction constant of the free layer was set to be negative. Therefore, in Comparative Examples 4 to 6, when the compressive stress acting in the longitudinal direction changes, the stress-induced magnetic anisotropy develops in the direction parallel or substantially parallel to the magnetosensitive direction. In Comparative Examples 4 to 6, the bias of the developed stress-induced magnetic anisotropy was changed.

Specifically, in Comparative Example 4, the stress-induced magnetic anisotropies oriented in the positive direction and the negative direction of the magnetosensitive direction are distributed at the same probability, and there is no bias in the stress-induced magnetic anisotropy. In Comparative Example 5, the ratio of the stress-induced magnetic anisotropy oriented in the positive direction of the magnetosensitive direction is large, and the stress-induced magnetic anisotropy is biased in the positive direction of the magnetosensitive direction. In Comparative Example 6, the ratio of the stress-induced magnetic anisotropy oriented in the negative direction of the magnetosensitive direction is large, and the stress-induced magnetic anisotropy is biased in the negative direction of the magnetosensitive direction.

In each of the magnetic sensor chips according to Examples 4 to 6, the magnetostriction constant of the free layer was set to be positive. Therefore, in Examples 4 to 6, when the compressive stress acting in the longitudinal direction changes, the stress-induced magnetic anisotropy develops in the direction perpendicular to the magnetosensitive direction. In Examples 4 to 6, the bias of the developed stress magnetic anisotropy was changed.

Specifically, in Example 4, the stress-induced magnetic anisotropies oriented in the positive direction and the negative direction in the direction perpendicular to the magnetosensitive direction are distributed at the same probability, and there is no bias in the stress-induced magnetic anisotropy. In Example 5, the ratio of the stress-induced magnetic anisotropy oriented in the positive direction in the direction perpendicular or substantially perpendicular to the magnetosensitive direction is large, and the stress-induced magnetic anisotropy is biased in the positive direction in the direction perpendicular or substantially perpendicular to the magnetosensitive direction. In Example 6, the ratio of the stress-induced magnetic anisotropy oriented in the negative direction in the direction perpendicular or substantially perpendicular to the magnetosensitive direction is large, and the stress-induced magnetic anisotropy is biased in the negative direction in the direction perpendicular or substantially perpendicular to the magnetosensitive direction.

In Comparative Examples 4 to 6 and Examples 4 to 6, the sensitivity and the offset voltage in the case where the compressive stress acting in the longitudinal direction of the substrate decreases with time will be described.

Regarding the sensitivity, in any of Comparative Examples 4 to 6, the sensitivity is large when a large compressive stress acts as in the initial state. Even when the compressive stress becomes small due to a change with time, since the compressive stress acts, the sensitivity becomes slightly large as compared with the case where the compressive stress does not act. Meanwhile, when the compressive stress decreases with time, the sensitivity decreases because the compressive stress becomes smaller than that in the initial state. Regarding such evaluation results, in FIG. 20, the items of sensitivity (large stress), sensitivity (small stress), and sensitivity variation (large stress→small stress) are written as ++, +, and −, respectively.

Regarding the offset voltage, in Comparative Example 4, since there is no bias in the stress-induced magnetic anisotropy that develops, the stress-induced magnetic anisotropy is not input in the magnetosensitive direction. For this reason, no offset voltage is generated in both the initial state and the state changed over time, and the offset voltage does not vary even when the stress varies. Regarding such evaluation results, in FIG. 20, the items of offset (large stress), offset (small stress), and offset variation (large stress→small stress) are written as No, No, and No, respectively.

Meanwhile, in Comparative Example 5, the stress-induced magnetic anisotropy is biased in the positive direction of the magnetosensitive direction as described above. Therefore, when a large compressive stress acts as in the initial state, a large positive offset voltage is generated. When the compressive stress decreases with time, a small positive offset voltage is generated. Therefore, when the compressive stress decreases with time, the offset voltage decreases. Regarding such evaluation results, in FIG. 20, the items of offset (large stress), offset (small stress), and offset variation (large stress→small stress) are written as ++, +, and −, respectively.

In Comparative Example 6, as described above, the stress-induced magnetic anisotropy is biased in the negative direction of the magnetosensitive direction. Therefore, when a large compressive stress acts as in the initial state, a large negative offset voltage is generated. When the compressive stress decreases with time, a small negative offset voltage is generated. Therefore, when the compressive stress decreases with time, the offset voltage increases. Regarding such evaluation results, in FIG. 20, the items of offset (large stress), offset (small stress), and offset variation (large stress→small stress) are written as −−, −, and +, respectively.

Regarding the sensitivity, in any of Examples 4 to 6, when a large compressive stress acts as in the initial state, the sensitivity decreases. Even in a case where the compressive stress is reduced due to a change with time, since the compressive stress acts, the sensitivity is slightly small as compared with the case where the compressive stress does not act. Meanwhile, when the compressive stress decreases with time, the sensitivity increases because the compressive stress becomes smaller than that in the initial state. Regarding such evaluation results, in FIG. 20, the items of sensitivity (large stress), sensitivity (small stress), and sensitivity variation (large stress→small stress) are written as −−, −, and +, respectively.

Regarding the offset voltage, in any of Examples 1 to 3, the stress-induced magnetic anisotropy is oriented in the direction perpendicular or substantially perpendicular to the magnetosensitive direction as described above. As such, the offset voltage is not generated regardless of the magnitude of the compressive stress and the presence or absence of the bias of the stress-induced magnetic anisotropy. Therefore, the offset voltage does not vary even when the compressive stress varies due to a change with time. Regarding such evaluation results, in FIG. 20, the items of offset (large stress), offset (small stress), and offset variation (large stress→small stress) are written as No, No, and No, respectively.

FIG. 21 is a diagram qualitatively illustrating a second evaluation result in a case where the longitudinal direction of the substrate and the magnetosensitive direction in the magnetic sensor chip are parallel or substantially parallel to each other and the stress acting on the substrate increases with time.

In performing the second evaluation, magnetic sensor chips according to Comparative Examples 1 to 6 and Examples 1 to 6 were prepared in the same manner as described above. The second evaluation is different from the first evaluation in that the stress acting on the substrate increases with time.

In Comparative Examples 1 to 3 and Examples 1 to 3, the sensitivity and the offset voltage in the case where the tensile stress acting in the longitudinal direction of the substrate increases with time will be described.

Regarding the sensitivity, in any of Comparative Examples 1 to 3, when the tensile stress slightly acts as in the initial state, the sensitivity is also slightly large. When the tensile stress becomes large due to a change with time, the sensitivity becomes large. Therefore, when the tensile stress increases with time, the sensitivity increases. Regarding such evaluation results, in FIG. 21, the items of sensitivity (small stress), sensitivity (large stress), and sensitivity variation (small stress→large stress) are written as +, ++, and +, respectively.

Regarding the offset voltage, in Comparative Example 1, since there is no bias in the stress-induced magnetic anisotropy that develops, the stress-induced magnetic anisotropy is not input in the magnetosensitive direction. For this reason, no offset voltage is generated in both the initial state and the state changed over time, and the offset voltage does not vary even when the stress varies. Regarding such evaluation results, in FIG. 21, the items of offset (small stress), offset (large stress), and offset variation (small stress→large stress) are written as No, No, and No, respectively.

Meanwhile, in Comparative Example 2, the stress-induced magnetic anisotropy is biased in the positive direction of the magnetosensitive direction as described above. Therefore, when a slightly large tensile stress acts as in the initial state, a small positive offset voltage is generated. When the tensile stress increases with time, a large positive offset voltage is generated. Therefore, when the tensile stress increases with time, the offset voltage increases. Regarding such evaluation results, in FIG. 21, the items of offset (small stress), offset (large stress), and offset variation (small stress→large stress) are written as +, ++, and +, respectively.

In Comparative Example 3, as described above, the stress-induced magnetic anisotropy is biased in the negative direction of the magnetosensitive direction. Therefore, when a slightly large tensile stress acts as in the initial state, a small negative offset voltage is generated. When the tensile stress increases with time, a large negative offset voltage is generated. Therefore, when the tensile stress increases with time, the offset voltage decreases. Regarding such evaluation results, in FIG. 21, the items of offset (small stress), offset (large stress), and offset variation (small stress→large stress) are written as −, −−, and −, respectively.

Regarding the sensitivity, in any of Examples 1 to 3, when the tensile stress slightly acts as in the initial state, the sensitivity slightly decreases. When the tensile stress increases due to a change with time, the sensitivity decreases. Therefore, when the tensile stress increases with time, the sensitivity decreases. Regarding such evaluation results, in FIG. 21, the items of sensitivity (small stress), sensitivity (large stress), and sensitivity variation (small stress→large stress) are written as −, −−, and −, respectively.

Regarding the offset voltage, in any of Examples 1 to 3, the stress-induced magnetic anisotropy is oriented in the direction perpendicular or substantially perpendicular to the magnetosensitive direction as described above. As such, the offset voltage is not generated regardless of the magnitude of the tensile stress and the presence or absence of the bias of the stress-induced magnetic anisotropy. Therefore, even when the tensile stress varies due to a change with time, the offset voltage does not vary. Regarding such evaluation results, in FIG. 20, the items of offset (small stress), offset (large stress), and offset variation (small stress→large stress) are written as No, No, and No, respectively.

In Comparative Examples 4 to 6 and Examples 4 to 6, the sensitivity and the offset voltage in the case where the compressive stress acting in the longitudinal direction of the substrate increases with time will be described.

Regarding the sensitivity, in any of Comparative Examples 4 to 6, the sensitivity is slightly large when the compressive stress slightly acts as in the initial state. The sensitivity becomes large in a case where the compressive stress becomes large due to a change with time. Therefore, when the compressive stress increases with time, the sensitivity increases. Regarding such evaluation results, in FIG. 21, the items of sensitivity (small stress), sensitivity (large stress), and sensitivity variation (small stress→large stress) are written as +, ++, and +, respectively.

Regarding the offset voltage, in Comparative Example 4, since there is no bias in the stress-induced magnetic anisotropy that develops, the stress-induced magnetic anisotropy is not input in the magnetosensitive direction. For this reason, no offset voltage is generated in both the initial state and the state changed over time, and the offset voltage does not vary even when the stress varies. Regarding such evaluation results, in FIG. 21, the items of offset (small stress), offset (large stress), and offset variation (small stress→large stress) are written as No, No, and No, respectively.

Meanwhile, in Comparative Example 5, the stress-induced magnetic anisotropy is biased in the positive direction of the magnetosensitive direction as described above. Therefore, when a slightly large compressive stress acts as in the initial state, a small positive offset voltage is generated. When the compressive stress increases with time, a large positive offset voltage is generated. Therefore, when the compressive stress increases with time, the offset voltage increases. Regarding such evaluation results, in FIG. 21, the items of offset (small stress), offset (large stress), and offset variation (small stress→large stress) are written as +, ++, and +, respectively.

In Comparative Example 6, as described above, the stress-induced magnetic anisotropy is biased in the negative direction of the magnetosensitive direction. Therefore, when a slightly large compressive stress acts as in the initial state, a small negative offset voltage is generated. When the compressive stress increases with time, a large negative offset voltage is generated. Therefore, when the compressive stress increases with time, the offset voltage decreases. Regarding such evaluation results, in FIG. 21, the items of offset (small stress), offset (large stress), and offset variation (small stress→large stress) are written as −, −−, and −, respectively.

Regarding the sensitivity, in any of Examples 4 to 6, the sensitivity slightly decreases when the compressive stress slightly acts as in the initial state. When the compressive stress becomes large due to a change with time, the sensitivity decreases. Therefore, when the compressive stress becomes large with time, the sensitivity decreases. Regarding such evaluation results, in FIG. 21, the items of sensitivity (small stress), sensitivity (large stress), and sensitivity variation (small stress→large stress) are written as −, −−, and −, respectively.

Regarding the offset voltage, in any of Examples 4 to 6, the stress-induced magnetic anisotropy is oriented in the direction perpendicular to the magnetosensitive direction as described above. As such, the offset voltage is not generated regardless of the magnitude of the compressive stress and the presence or absence of the bias of the stress-induced magnetic anisotropy. Therefore, the offset voltage does not vary even when the compressive stress varies due to a change with time. Regarding such evaluation results, in FIG. 21, the items of offset (small stress), offset (large stress), and offset variation (small stress→large stress) are written as No, No, and No, respectively.

FIG. 22 is a diagram qualitatively illustrating a third evaluation result in a case where the longitudinal direction of the substrate and the magnetosensitive direction in the magnetic sensor chip are perpendicular or substantially perpendicular to each other and the stress acting on the substrate decreases with time.

In performing the third evaluation, magnetic sensors according to Comparative Examples 7 to 12 and Examples 7 to 12 of preferred embodiments of the present invention were prepared.

As the magnetic sensor chips according to Comparative Examples 7 to 9 and Examples 7 to 9, magnetic sensor chips were prepared in which the tensile stress acted as the initial stress in the first direction (the longitudinal direction of the substrate 11) in which the stress predominantly acted, and the magnetosensitive direction was perpendicular or substantially perpendicular to the longitudinal direction. In addition, the direction of magnetic anisotropy of the free layer in a state in which no external magnetic field acts on the magnetic sensor chip was set to be parallel or substantially parallel to the stacking direction and perpendicular to the magnetosensitive direction. Note that the magnetic sensor chips according to Examples 7 to 9 that had the same or substantially the same configuration as that of the magnetic sensor chip 10G according to Preferred Embodiment 7 were used.

In each of the magnetic sensor chips according to Comparative Examples 7 to 9, the magnetostriction constant of the free layer was set to be negative. In Comparative Examples 7 to 9, when the tensile stress acting in the longitudinal direction changes, stress-induced magnetic anisotropy develops in a direction parallel or substantially parallel to the magnetosensitive direction. In Comparative Examples 7 to 9, the bias of the generated stress-induced magnetic anisotropy was changed.

Specifically, in Comparative Example 7, the stress-induced magnetic anisotropies oriented in the positive direction and the negative direction of the magnetosensitive direction are distributed at the same probability, and there is no bias in the stress-induced magnetic anisotropy. In Comparative Example 8, the ratio of the stress-induced magnetic anisotropy oriented in the positive direction of the magnetosensitive direction is large, and the stress-induced magnetic anisotropy is biased in the positive direction of the magnetosensitive direction. In Comparative Example 9, the ratio of the stress-induced magnetic anisotropy oriented in the negative direction of the magnetosensitive direction is large, and the stress-induced magnetic anisotropy is biased in the negative direction of the magnetosensitive direction.

In each of the magnetic sensor chips according to Examples 7 to 9, the magnetostriction constant of the free layer was set to be positive. Therefore, in Examples 7 to 9, when the tensile stress acting in the longitudinal direction changes, the stress-induced magnetic anisotropy develops in the direction perpendicular to the magnetosensitive direction. In Examples 7 to 9, the bias of the developed stress magnetic anisotropy was changed.

Specifically, in Example 7, the stress-induced magnetic anisotropies oriented in the positive direction and the negative direction in the direction perpendicular or substantially perpendicular to the magnetosensitive direction are distributed at the same probability, and there is no bias in the stress-induced magnetic anisotropy. In Example 8, the ratio of the stress-induced magnetic anisotropy oriented in the positive direction in the direction perpendicular or substantially perpendicular to the magnetosensitive direction is large, and the stress-induced magnetic anisotropy is biased in the positive direction in the direction perpendicular or substantially perpendicular to the magnetosensitive direction. In Example 9, the ratio of the stress-induced magnetic anisotropy oriented in the negative direction in the direction perpendicular or substantially perpendicular to the magnetosensitive direction is large, and the stress-induced magnetic anisotropy is biased in the negative direction in the direction perpendicular or substantially perpendicular to the magnetosensitive direction.

In Comparative Examples 7 to 9 and Examples 7 to 9, the sensitivity and the offset voltage in the case where the tensile stress acting in the longitudinal direction of the substrate decreases with time will be described.

Regarding the sensitivity, in any of Comparative Examples 7 to 9, the sensitivity is large when a large tensile stress acts as in the initial state. Even when the tensile stress becomes small due to a change with time, since the tensile stress acts, the sensitivity becomes slightly large as compared with the case where the tensile stress does not act. Meanwhile, when the tensile stress decreases with time, the sensitivity decreases because the tensile stress becomes smaller than that in the initial state. Regarding such evaluation results, in FIG. 22, the items of sensitivity (large stress), sensitivity (small stress), and sensitivity variation (large stress→small stress) are written as ++, +, and −, respectively.

Regarding the offset voltage, in Comparative Example 7, since there is no bias in the stress-induced magnetic anisotropy that develops, the stress-induced magnetic anisotropy is not input in the magnetosensitive direction. For this reason, no offset voltage is generated in both the initial state and the state changed over time, and the offset voltage does not vary even when the stress varies. Regarding such evaluation results, in FIG. 22, the items of offset (large stress), offset (small stress), and offset variation (large stress→small stress) are written as No, No, and No, respectively.

Meanwhile, in Comparative Example 8, the stress-induced magnetic anisotropy is biased in the positive direction of the magnetosensitive direction as described above. Therefore, when a large tensile stress acts as in the initial state, a large positive offset voltage is generated. When the tensile stress decreases with time, a small positive offset voltage is generated. Therefore, when the tensile stress decreases with time, the offset voltage decreases. Regarding such evaluation results, in FIG. 22, the items of offset (large stress), offset (small stress), and offset variation (large stress→small stress) are written as ++, +, and −, respectively.

In Comparative Example 9, as described above, the stress-induced magnetic anisotropy is biased in the negative direction of the magnetosensitive direction. Therefore, when a large tensile stress acts as in the initial state, a large negative offset voltage is generated. When the tensile stress decreases with time, a small negative offset voltage is generated. Therefore, when the tensile stress decreases with time, the offset voltage increases. Regarding such evaluation results, in FIG. 22, the items of offset (large stress), offset (small stress), and offset variation (large stress→small stress) are written as −−, −, and +, respectively.

Regarding the sensitivity, in any of Examples 7 to 9, when a large tensile stress acts as in the initial state, the sensitivity decreases. Even in the case where the tensile stress becomes small due to a change with time, since the tensile stress acts, the sensitivity becomes slightly small as compared with the case where the tensile stress does not act. Meanwhile, when the tensile stress decreases with time, the sensitivity increases because the tensile stress becomes smaller than that in the initial state. Regarding such evaluation results, in FIG. 22, the items of sensitivity (large stress), sensitivity (small stress), and sensitivity variation (large stress→small stress) are written as −−, −, and +, respectively.

Regarding the offset voltage, in any of Examples 7 to 9, the stress-induced magnetic anisotropy is oriented in the direction perpendicular or substantially perpendicular to the magnetosensitive direction as described above. As such, the offset voltage is not generated regardless of the magnitude of the tensile stress and the presence or absence of the bias of the stress-induced magnetic anisotropy. Therefore, even when the tensile stress varies due to a change with time, the offset voltage does not vary. Regarding such evaluation results, in FIG. 22, the items of offset (large stress), offset (small stress), and offset variation (large stress→small stress) are written as No, No, and No, respectively.

As the magnetic sensor chips according to Comparative Examples 10 to 12 and Examples 10 to 12, magnetic sensor chips were prepared in which the compressive stress acted as the initial stress in the first direction (the longitudinal direction of the substrate 11) in which the stress predominantly acted, and the magnetosensitive direction was perpendicular or substantially perpendicular to the longitudinal direction. In addition, the direction of magnetic anisotropy of the free layer in a state in which no external magnetic field acts on the magnetic sensor chip was set to be parallel or substantially parallel to the stacking direction and perpendicular or substantially perpendicular to the magnetosensitive direction. Note that the magnetic sensor chips according to Examples 10 to 12 that had the same or substantially the same configuration as that of the magnetic sensor chip 10E according to Preferred Embodiment 5 were used.

In each of the magnetic sensor chips according to Comparative Examples 10 to 12, the magnetostriction constant of the free layer was set to be negative. In Comparative Examples 10 to 12, when the compressive stress acting in the longitudinal direction changes, the stress-induced magnetic anisotropy develops in the direction parallel to the magnetosensitive direction. In Comparative Examples 10 to 12, the bias of the developed stress-induced magnetic anisotropy was changed.

Specifically, in Comparative Example 10, the stress-induced magnetic anisotropies oriented in the positive direction and the negative direction of the magnetosensitive direction are distributed at the same probability, and there is no bias in the stress-induced magnetic anisotropy. In Comparative Example 11, the ratio of the stress-induced magnetic anisotropy oriented in the positive direction of the magnetosensitive direction is large, and the stress-induced magnetic anisotropy is biased in the positive direction of the magnetosensitive direction. In Comparative Example 12, the ratio of the stress-induced magnetic anisotropy oriented in the negative direction of the magnetosensitive direction is large, and the stress-induced magnetic anisotropy is biased in the negative direction of the magnetosensitive direction.

In each of the magnetic sensor chips according to Examples 10 to 12, the magnetostriction constant of the free layer was set to be positive. Therefore, in Examples 10 to 12, when the compressive stress acting in the longitudinal direction changes, the stress-induced magnetic anisotropy develops in the direction perpendicular to the magnetosensitive direction. In Examples 10 to 12, the bias of the developed stress magnetic anisotropy was changed.

Specifically, in Example 10, the stress-induced magnetic anisotropies oriented in the positive direction and the negative direction in the direction perpendicular or substantially perpendicular to the magnetosensitive direction are distributed at the same probability, and there is no bias in the stress-induced magnetic anisotropy. In Example 11, the ratio of the stress-induced magnetic anisotropy oriented in the positive direction in the direction perpendicular or substantially perpendicular to the magnetosensitive direction is large, and the stress-induced magnetic anisotropy is biased in the positive direction in the direction perpendicular or substantially perpendicular to the magnetosensitive direction. In Example 12, the ratio of the stress-induced magnetic anisotropy oriented in the negative direction in the direction perpendicular or substantially perpendicular to the magnetosensitive direction is large, and the stress-induced magnetic anisotropy is biased in the negative direction in the direction perpendicular or substantially perpendicular to the magnetosensitive direction.

In Comparative Examples 10 to 12 and Examples 10 to 12, the sensitivity and the offset voltage in the case where the tensile stress acting in the longitudinal direction of the substrate decreases with time will be described.

Regarding the sensitivity, in any of Comparative Examples 10 to 12, the sensitivity is large when a large compressive stress acts as in the initial state. Even when the compressive stress becomes small due to a change with time, since the compressive stress acts, the sensitivity becomes slightly large as compared with the case where the compressive stress does not act. Meanwhile, when the compressive stress decreases with time, the sensitivity decreases because the compressive stress becomes smaller than that in the initial state. Regarding such evaluation results, in FIG. 22, the items of sensitivity (large stress), sensitivity (small stress), and sensitivity variation (large stress→small stress) are written as ++, +, and −, respectively.

Regarding the offset voltage, in Comparative Example 10, since there is no bias in the stress-induced magnetic anisotropy that develops, the stress-induced magnetic anisotropy is not input in the magnetosensitive direction. For this reason, no offset voltage is generated in both the initial state and the state changed over time, and the offset voltage does not vary even when the stress varies. Regarding such evaluation results, in FIG. 22, the items of offset (large stress), offset (small stress), and (offset variation (large stress→small stress) are written as No, No, and No, respectively.

Meanwhile, in Comparative Example 11, the stress-induced magnetic anisotropy is biased in the positive direction of the magnetosensitive direction as described above. Therefore, when a large compressive stress acts as in the initial state, a large positive offset voltage is generated. When the compressive stress decreases with time, a small positive offset voltage is generated. Therefore, when the compressive stress decreases with time, the offset voltage decreases. Regarding such evaluation results, in FIG. 22, the items of offset (large stress), offset (small stress), and offset variation (large stress→small stress) are written as ++, +, and −, respectively.

In Comparative Example 12, as described above, the stress-induced magnetic anisotropy is biased in the negative direction of the magnetosensitive direction. Therefore, when a large compressive stress acts in the initial state, a large negative offset voltage is generated. When the compressive stress decreases with time, a small negative offset voltage is generated. Therefore, when the compressive stress decreases with time, the offset voltage increases. Regarding such evaluation results, in FIG. 22, the items of offset (large stress), offset (small stress), and offset variation (large stress→small stress) are written as −−, −, and +, respectively.

Regarding the sensitivity, in any of Examples 10 to 12, when a large tensile stress acts as in the initial state, sensitivity decreases. Even in the case where the tensile stress becomes small due to a change with time, since the tensile stress acts, the sensitivity becomes slightly small as compared with the case where the tensile stress does not act. Meanwhile, when the tensile stress decreases with time, the sensitivity increases because the tensile stress becomes smaller than that in the initial state. Regarding such evaluation results, in FIG. 22, the items of sensitivity (large stress), sensitivity (small stress), and sensitivity variation (large stress→small stress) are written as −−, −, and +, respectively.

Regarding the offset voltage, in any of Examples 10 to 12, the stress-induced magnetic anisotropy is oriented in the direction perpendicular or substantially perpendicular to the magnetosensitive direction as described above. As such, the offset voltage is not generated regardless of the magnitude of the tensile stress and the presence or absence of the bias of the stress-induced magnetic anisotropy. Therefore, even when the tensile stress varies due to a change with time, the offset voltage does not vary. Regarding such evaluation results, in FIG. 22, the items of offset (large stress), offset (small stress), and offset variation (large stress→small stress) are written as No, No, and No, respectively.

FIG. 23 is a diagram qualitatively illustrating a fourth evaluation result in a case where the longitudinal direction of the substrate and the magnetosensitive direction in the magnetic sensor chip are perpendicular or substantially perpendicular to each other and the stress acting on the substrate increases with time.

In performing the fourth evaluation, magnetic sensor chips according to Comparative Examples 7 to 12 and Examples 7 to 12 were prepared in the same or substantially the same manner as described above. The fourth evaluation is different from the third evaluation in that the stress acting on the substrate increases with time.

In Comparative Examples 7 to 9 and Examples 7 to 9, the sensitivity and the offset voltage in the case where the tensile stress acting in the longitudinal direction of the substrate increases with time will be described.

Regarding the sensitivity, in any of Comparative Examples 7 to 9, when a slightly large tensile stress acts as in the initial state, the sensitivity is slightly large. When the tensile stress is increased by the change with time, the sensitivity is increased. Therefore, when the tensile stress increases with time, the sensitivity increases. Regarding such evaluation results, in FIG. 23, the items of sensitivity (small stress), sensitivity (large stress), and sensitivity variation (small stress→large stress) are written as +, ++, and +, respectively.

Regarding the offset voltage, in Comparative Example 7, since there is no bias in the stress-induced magnetic anisotropy that develops, the stress-induced magnetic anisotropy is not input in the magnetosensitive direction. For this reason, no offset voltage is generated in both the initial state and the state changed over time, and the offset voltage does not vary even when the stress varies. Regarding such evaluation results, in FIG. 23, the items of offset (small stress), offset (large stress), and offset variation (small stress→large stress) are written as No, No, and No, respectively.

Meanwhile, in Comparative Example 8, the stress-induced magnetic anisotropy is biased in the positive direction of the magnetosensitive direction as described above. Therefore, when a slightly large tensile stress acts as in the initial state, a small positive offset voltage is generated. When the tensile stress increases with time, a large positive offset voltage is generated. Therefore, when the tensile stress increases with time, the offset voltage increases. Regarding such evaluation results, in FIG. 23, the items of offset (small stress), offset (large stress), and offset variation (small stress→large stress) are written as +, ++, and +, respectively.

In Comparative Example 9, as described above, the stress-induced magnetic anisotropy is biased in the negative direction of the magnetosensitive direction. Therefore, when a slightly large tensile stress acts as in the initial state, a small negative offset voltage is generated. When the tensile stress increases with time, a large negative offset voltage is generated. Therefore, when the tensile stress increases with time, the offset voltage decreases. Regarding such evaluation results, in FIG. 23, the items of offset (small stress), offset (large stress), and offset variation (small stress→large stress) are written as −, −−, and −, respectively.

Regarding the sensitivity, in any of Examples 7 to 9, when the tensile stress slightly acts as in the initial state, the sensitivity slightly decreases. When the tensile stress increases due to a change with time, the sensitivity decreases. Therefore, when the tensile stress increases with time, the sensitivity decreases. Regarding such evaluation results, in FIG. 23, the items of sensitivity (small stress), sensitivity (large stress), and sensitivity variation (small stress→large stress) are written as −, −−, and −, respectively.

Regarding the offset voltage, in any of Examples 7 to 9, the stress-induced magnetic anisotropy is oriented in the direction perpendicular or substantially perpendicular to the magnetosensitive direction as described above. As such, the offset voltage is not generated regardless of the magnitude of the tensile stress and the presence or absence of the bias of the stress-induced magnetic anisotropy. Therefore, even when the tensile stress varies due to a change with time, the offset voltage does not vary. Regarding such evaluation results, in FIG. 23, the items of offset (small stress), offset (large stress), and offset variation (small stress→large stress) are written as No, No, and No, respectively.

In Comparative Examples 10 to 12 and Examples 10 to 12, the sensitivity and the offset voltage in the case where the compressive stress acting in the longitudinal direction of the substrate increases with time will be described.

Regarding the sensitivity, in any of Comparative Examples 10 to 12, the sensitivity is slightly large when the compressive stress slightly acts as in the initial state. The sensitivity becomes large in a case where the compressive stress becomes large due to a change with time. Therefore, when the compressive stress increases with time, the sensitivity increases. Regarding such evaluation results, in FIG. 23, the items of sensitivity (small stress), sensitivity (large stress), and sensitivity variation (small stress→large stress) are written as +, ++, and +, respectively.

Regarding the offset voltage, in Comparative Example 10, since there is no bias in the stress-induced magnetic anisotropy that develops, the stress-induced magnetic anisotropy is not input in the magnetosensitive direction. For this reason, no offset voltage is generated in both the initial state and the state changed over time, and the offset voltage does not vary even when the stress varies. Regarding such evaluation results, in FIG. 23, the items of offset (small stress), offset (large stress), and offset variation (small stress→large stress) are written as No, No, and No, respectively.

Meanwhile, in Comparative Example 11, the stress-induced magnetic anisotropy is biased in the positive direction of the magnetosensitive direction as described above. Therefore, when a slightly large compressive stress acts as in the initial state, a small positive offset voltage is generated. When the compressive stress increases with time, a large positive offset voltage is generated. Therefore, when the compressive stress increases with time, the offset voltage increases. Regarding such evaluation results, in FIG. 23, the items of offset (small stress), offset (large stress), and offset variation (small stress→large stress) are written as +, ++, and +, respectively.

In Comparative Example 12, as described above, the stress-induced magnetic anisotropy is biased in the negative direction of the magnetosensitive direction. Therefore, when a slightly large compressive stress acts as in the initial state, a small negative offset voltage is generated. When the compressive stress increases with time, a large negative offset voltage is generated. Therefore, when the compressive stress increases with time, the offset voltage decreases. Regarding such evaluation results, in FIG. 23, the items of offset (small stress), offset (large stress), and offset variation (small stress→large stress) are written as −, −−, and −, respectively.

Regarding the sensitivity, in any of Examples 10 to 12, the sensitivity slightly decreases when the compressive stress slightly acts as in the initial state. When the compressive stress becomes large due to a change with time, the sensitivity decreases. Therefore, when the compressive stress becomes large with time, the sensitivity decreases. Regarding such evaluation results, in FIG. 23, the items of sensitivity (small stress), sensitivity (large stress), and sensitivity variation (small stress→large stress) are written as −, −−, and −, respectively.

Regarding the offset voltage, in any of Examples 10 to 12, the stress-induced magnetic anisotropy is oriented in the direction perpendicular to the magnetosensitive direction as described above. As such, the offset voltage is not generated regardless of the magnitude of the compressive stress and the presence or absence of the bias of the stress-induced magnetic anisotropy. Therefore, the offset voltage does not vary even when the compressive stress varies due to a change with time. Regarding such evaluation results, in FIG. 23, the items of offset (small stress), offset (large stress), and offset variation (small stress→large stress) are written as No, No, and No, respectively.

As described above, according to the first evaluation result to the fourth evaluation result in the Comparative examples 1 to 12, in the configuration of the comparative example, when the magnetic anisotropy of the free layer is biased, the offset voltage varies when the stress varies with time. Meanwhile, from the first evaluation result to the fourth evaluation result in Examples 1 to 12, in the configuration in the example, even when the magnetic anisotropy of the free layer is biased, the offset voltage does not vary when the stress varies with time. Therefore, in the example, it was confirmed that reliability with respect to the stress variation was improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A magnetic sensor chip that detects an external magnetic field, the magnetic sensor chip comprising:
   a substrate including a first main surface; and
   a magnetoresistive element on the first main surface and having a predetermined magnetosensitive direction parallel or substantially parallel to the first main surface; wherein
   the magnetoresistive element includes a reference layer in which a magnetization direction is fixed, a free layer in which a magnetization direction is changed by an external magnetic field, and an intermediate layer interposed between the reference layer and the free layer;
   the reference layer, the intermediate layer, and the free layer are stacked in a stacking direction perpendicular or substantially perpendicular to the first main surface;
   a direction of magnetic anisotropy of the free layer in a state in which no external magnetic field acts on the magnetic sensor chip is parallel or substantially parallel to the stacking direction and perpendicular or substantially perpendicular to the magnetosensitive direction; and
   when a stress acts on the substrate predominantly in a first direction parallel or substantially parallel to the first main surface, a direction of stress-induced magnetic anisotropy in the free layer is perpendicular or substantially perpendicular to the magnetosensitive direction and the stacking direction.

2. The magnetic sensor chip according to claim 1, wherein the free layer has a positive magnetostriction constant;
   a compressive stress acts on the substrate in the first direction; and
   the first direction is parallel or substantially parallel to the magnetosensitive direction and perpendicular or substantially perpendicular to the stacking direction.

3. The magnetic sensor chip according to claim 1, wherein the free layer has a negative magnetostriction constant;
   a tensile stress acts on the substrate in the first direction; and
   the first direction is parallel or substantially parallel to the magnetosensitive direction and perpendicular or substantially perpendicular to the stacking direction.

4. The magnetic sensor chip according to claim 2, wherein the substrate has a longitudinal shape extending in a longitudinal direction; and
   the longitudinal direction is parallel or substantially parallel to the first direction and parallel or substantially parallel to the magnetosensitive direction.

5. The magnetic sensor chip according to claim 3, wherein the substrate has a longitudinal shape extending in a longitudinal direction; and
   the longitudinal direction is parallel or substantially parallel to the first direction and parallel or substantially parallel to the magnetosensitive direction.

6. The magnetic sensor chip according to claim 1, wherein the free layer has a negative magnetostriction constant;
   a compressive stress acts on the substrate in the first direction; and
   the first direction is perpendicular or substantially perpendicular to the magnetosensitive direction and perpendicular or substantially perpendicular to the stacking direction.

7. The magnetic sensor chip according to claim 1, wherein the free layer has a positive magnetostriction constant;
   a tensile stress acts on the substrate in the first direction and
   the first direction is perpendicular or substantially perpendicular to the magnetosensitive direction and perpendicular or substantially perpendicular to the stacking direction.

8. The magnetic sensor chip according to claim 6, wherein the substrate has a longitudinal shape extending in a longitudinal direction; and
   the longitudinal direction is parallel or substantially parallel to the first direction and perpendicular or substantially perpendicular to the magnetosensitive direction.

9. The magnetic sensor chip according to claim 7, wherein the substrate has a longitudinal shape extending in a longitudinal direction; and
   the longitudinal direction is parallel or substantially parallel to the first direction and perpendicular or substantially perpendicular to the magnetosensitive direction.

10. The magnetic sensor chip according to claim 1, wherein the free layer has a magnetic vortex structure magnetized in a vortex around an axis perpendicular or substantially perpendicular to a film surface.

11. The magnetic sensor chip according to claim 1, wherein the free layer has a disk shape.

12. The magnetic sensor chip according to claim 1, wherein the free layer includes a perpendicular magnetization film.

13. The magnetic sensor chip according to claim 1, wherein the magnetoresistive element includes a TMR element.

14. The magnetic sensor chip according to claim 1, wherein the magnetoresistive element includes a GMR element.

15. The magnetic sensor chip according to claim 1, wherein the magnetoresistive element includes a first magnetoresistive element and a second magnetoresistive element defining a half-bridge circuit.

16. The magnetic sensor chip according to claim 1, wherein
   the magnetoresistive element includes a first magnetoresistive element and a second magnetoresistive element defining a first half-bridge circuit, and a third magnetoresistive element and a fourth magnetoresistive element defining a second half-bridge circuit; and
   a full-bridge circuit is defined by the first half-bridge circuit and the second half-bridge circuit.

17. A magnetic sensor device comprising:
   the magnetic sensor chip according to claim 1; and
   a mounting substrate on which the magnetic sensor chip is mounted.

18. The magnetic sensor device according to claim 17, wherein
   the free layer has a positive magnetostriction constant;
   a compressive stress acts on the substrate in the first direction; and
   the first direction is parallel or substantially parallel to the magnetosensitive direction and perpendicular or substantially perpendicular to the stacking direction.

19. A magnetic sensor device comprising:
   the magnetic sensor chip according to claim 1;
   a mounting substrate on which the magnetic sensor chip is mounted; and
   a sealing resin sealing the magnetic sensor chip; wherein
   a thermal expansion coefficient of the substrate in the magnetic sensor chip is different from a thermal expansion coefficient of the sealing resin.

20. A magnetic sensor device comprising:
the magnetic sensor chip according to claim 1; and
a mounting substrate on which the magnetic sensor chip is mounted; wherein
a structure having a thermal expansion coefficient larger than a thermal expansion coefficient of the substrate is not provided around the first main surface.

* * * * *